United States Patent
Huber et al.

(10) Patent No.: US 9,857,247 B2
(45) Date of Patent: Jan. 2, 2018

(54) METHOD AND DEVICE FOR SENSING ISOTROPIC STRESS AND PROVIDING A COMPENSATION FOR THE PIEZO-HALL EFFECT

(71) Applicant: MELEXIS TECHNOLOGIES NV, Tessenderlo (BE)

(72) Inventors: Samuel Huber, Jenaz (CH); Johan Raman, Knesselare (BE); Pieter Rombouts, Mariakerke (BE); Appolonius Jacobus Van Der Wiel, Duisburg (BE)

(73) Assignee: MELEXIS TECHNOLOGIES NV, Tessenderlo (BE)

(*) Notice: Subject to any disclaimer, the term of this patent is extended or adjusted under 35 U.S.C. 154(b) by 506 days.

(21) Appl. No.: 14/399,623

(22) PCT Filed: May 7, 2013

(86) PCT No.: PCT/EP2013/059545
§ 371 (c)(1),
(2) Date: Nov. 7, 2014

(87) PCT Pub. No.: WO2013/167631
PCT Pub. Date: Nov. 14, 2013

(65) Prior Publication Data
US 2015/0142342 A1    May 21, 2015

(30) Foreign Application Priority Data
May 7, 2012   (EP) .................................... 12167042

(51) Int. Cl.
*G01R 33/06*   (2006.01)
*G01L 1/22*    (2006.01)
(Continued)

(52) U.S. Cl.
CPC ............ *G01L 1/2293* (2013.01); *G01L 1/125* (2013.01); *G01L 1/18* (2013.01); *G01R 33/0029* (2013.01); *G01R 33/0035* (2013.01); *G01R 33/07* (2013.01)

(58) Field of Classification Search
USPC .................................... 324/251, 207.2, 727
See application file for complete search history.

(56) References Cited

U.S. PATENT DOCUMENTS 5,406,202 A * 4/1995 Mehrgardt ............. G01D 5/142
                                                    324/225
5,621,319 A * 4/1997 Bilotti .................... G01R 33/07
                                                    324/225
(Continued)

FOREIGN PATENT DOCUMENTS

DE         4302342 A1    7/1993
DE        10154495 A1    5/2003
(Continued)

OTHER PUBLICATIONS

Law et al., "A High Sensitivity MEMS Pressure Sensor", 2007 IEEE Workshop on Microelectronics and Electron Devices, dated Apr. 20, 2007, 3 Pages.
(Continued)

*Primary Examiner* — Lam Nguyen
(74) *Attorney, Agent, or Firm* — Justin Cassell; Workman Nydegger

(57) ABSTRACT

A method determines isotropic stress by means of a Hall element which includes a plate-shaped area made of a doped semiconductor material and comprises four contacts contacting the plate-shaped area and forming corners of a quadrangle, two neighboring corners of the quadrangle defining an edge thereof. At least one van der Pauw transresistance value in at least one van der Pauw measurement set-up of the Hall element is determined, wherein the four
(Continued)

contacts of the Hall element form contact pairs, a contact pair comprising two contacts defining neighboring corners of the quadrangle. One contact pair supplies a current and the other contact pair measures a voltage. A relationship between the supplied current and the measured voltage defines the Van der Pauw transresistance value. The method comprises determining a stress signal which depends on the at least one Van der Pauw transresistance value and determining isotropic stress.

20 Claims, 3 Drawing Sheets

(51) Int. Cl.
*G01R 33/07* (2006.01)
*G01L 1/18* (2006.01)
*G01R 33/00* (2006.01)
*G01L 1/12* (2006.01)

(56) References Cited

U.S. PATENT DOCUMENTS

| | | | |
|---|---|---|---|
| 6,265,864 B1* | 7/2001 | De Winter | G01D 5/142 324/207.2 |
| 6,362,618 B1* | 3/2002 | Motz | G01R 33/07 324/225 |
| 6,768,301 B1 | 7/2004 | Hohe et al. | |
| 6,906,514 B2 | 6/2005 | Ausserlechner | |
| 7,119,533 B2 | 10/2006 | Tamura et al. | |
| 7,302,357 B2 | 11/2007 | Ausserlechner et al. | |
| 7,345,476 B2 | 3/2008 | Middelhoek et al. | |
| 7,437,260 B2 | 10/2008 | Ausserlechner et al. | |
| 7,440,861 B2 | 10/2008 | Ausserlechner et al. | |
| 7,980,138 B2 | 7/2011 | Ausserlechner | |
| 2001/0050557 A1 | 12/2001 | Kempe | |
| 2005/0001487 A1 | 1/2005 | Ausserlechner | |
| 2005/0162160 A1 | 7/2005 | Ausserlechner et al. | |
| 2006/0066295 A1 | 3/2006 | Tamura et al. | |
| 2007/0018655 A1 | 1/2007 | Ausserlechner et al. | |
| 2007/0029999 A1 | 2/2007 | Middelhoek et al. | |
| 2008/0111565 A1 | 5/2008 | Ausserlechner et al. | |
| 2009/0108839 A1 | 4/2009 | Ausserlechner | |
| 2011/0074404 A1* | 3/2011 | Hikichi | G01R 33/072 324/251 |

FOREIGN PATENT DOCUMENTS

| | | |
|---|---|---|
| DE | 10154498 A1 | 5/2003 |
| DE | 102004003853 A1 | 8/2005 |
| DE | 102005029464 A1 | 12/2006 |
| DE | 102008051949 A1 | 5/2009 |
| EP | 0548391 A1 | 6/1993 |
| EP | 1496344 A2 | 1/2005 |
| JP | H08220202 A | 8/1996 |
| JP | H1038611 A | 2/1998 |
| JP | H11108972 A | 4/1999 |
| JP | 2007502965 A | 2/2007 |
| WO | 0118556 A1 | 3/2001 |
| WO | 2006035505 A1 | 4/2006 |

OTHER PUBLICATIONS

Mian et al., "The van der Pauw Stress Sensor", IEEE Sensors Journal, vol. 6, No. 2, Apr. 2006, pp. 340-356.
Japanese Office Action from Japanese Application No. 2015-510807, dated Mar. 21, 2017.
Wakeshima et al., "New Measurement System of Specific Resistivity and Hall Coefficient by Four-probe van der Pauw Method", vol. 52, No. 1 and 2, Dec. 1996. 12 Pages.
European Search Report for corresponding European Application No. 12167042.6, dated Oct. 29, 2012.
Halg, "Piezo-Hall Coefficients of N-Type Silicon," J. Appl. Physics, Jul. 1, 1988, pp. 276-282, vol. 64, No. 1.
International Search Report for corresponding International PCT Application No. PCT/EP2013/059545, dated Sep. 30, 2013.
Jaeger et al., "CMOS Stress Sensors on (100) Silicon," IEEE Journal of Solid-State Circuits, Jan. 1, 2000, pp. 85-95, vol. 35, No. 1.
Kanda, "A Graphical Representation of Piezoresistance Coefficients in Silicon," IEEE Transactions on Electron Devices, Jan. 1, 1982, pp. 64-70, vol. ED-29, No. 1.
Law et al., "A High Sensitivity MEMS Pressure Sensor," 2007 IEEE Workshop on Microelectronics and Electron Devices, Apr. 1, 2007, pp. 51-52.
Mian et al., "The van der Pauw Stress Sensor," IEEE Sensors Journal, Apr. 2, 2006, pp. 340-356, vol. 6, No. 2.
Shibata et al., "A potential problem for point contacts on a two-dimensional anisotropic medium with an arbitrary resistivity tensor," J. Appl. Phys., Nov. 15, 1989, pp. 4603-4607, vol. 66, No. 10.
Smith, "Piezoresistance Effect in Germanium and Silicon," Physical Review, Apr. 1, 1954, pp. 42-49, vol. 94, No. 1.
Van Der Pauw, "A Method of Measuring the Resistivity and Hall Coefficient on Lamellae of Arbitrary Shape," Philips Technical Review, 1958, pp. 220-224, vol. 20, No. 8.

* cited by examiner

METHOD AND DEVICE FOR SENSING ISOTROPIC STRESS AND PROVIDING A COMPENSATION FOR THE PIEZO-HALL EFFECT

FIELD OF THE INVENTION

The present invention relates to methods and devices for sensing isotropic stress by means of a plate-like structure similar to a Hall plate. The present invention also relates to methods and devices for stress-compensation of the piezo-Hall effect in sensors comprising a Hall plate, more particularly by using measurements on the Hall plate itself.

BACKGROUND OF THE INVENTION

Hall elements are magnetic field sensors which are based on the Hall effect and provide an electrical output signal which is proportional to a predetermined component of the magnetic field. A Hall sensor comprises a Hall element or a cluster of Hall elements and an electronic circuit for operating the Hall element(s) and for evaluating the output signals of the Hall elements. The Hall sensor is manufactured as an integrated circuit which is embedded in a semiconductor chip. The semiconductor chip is packaged in a housing. Hall elements have an offset which arises from process- and geometry-related variations. The offset can be effectively minimized by connecting a plurality of Hall elements in parallel (cluster) and/or by operating using the known spinning current method. This is known from numerous patent documents, for example, WO 0118556, EP 548391, and DE 4302342.

The semiconductor chip packaged in the housing is subjected to mechanical stresses which depend on environmental influences such as temperature and humidity. The varying mechanical stresses cause changes in the offset of the Hall elements, as well as changes in the sensitivity of the Hall elements due to the piezo-Hall effect. Changes in the offset are effectively suppressed using the measures described above. In order to compensate for the changes in sensitivity, it is known, for example, from DE 10154495, DE 10154498, DE 102004003853, DE 102008051949, to use a stress sensor which detects the mechanical stresses, and to use its output signal to compensate for the change in sensitivity of the Hall elements caused by the piezo-Hall effect.

SUMMARY OF THE INVENTION

It is an object of embodiments of the present invention to provide a practical method for compensation of the piezo-Hall effect in a Hall element.

The above objective is accomplished by a method and device according to embodiments of the present invention. In particular, the above objective is obtained by compensation based on piezo-resistive measurements done on the Hall element.

It is an advantage of embodiments of the present invention that isotropic stress in a semiconductor chip is measured. It is an advantage of embodiments of the present invention that the changes in sensitivity of a Hall element caused by the isotropic stress and the piezo-Hall effect may be compensated for. It is an advantage of embodiments of the present invention that a Hall sensor is developed which is largely stress-compensated, e.g. with a remaining sensitivity drift below 1%.

In a first aspect, the present invention provides a method for determining isotropic stress by means of a Hall element which has a plate-shaped area made of a doped semiconductor material and comprises four contacts contacting the plate-shaped area. The contacts form corners of a quadrangle, two neighbouring corners of the quadrangle defining an edge thereof. The method comprises determining at least one van der Pauw transresistance value in at least one van der Pauw measurement set-up of the Hall element, wherein the four contacts of the Hall element form contact pairs, a contact pair comprising two contacts which are neighbouring corners of the quadrangle. In this set-up, one contact pair is used for supplying a current and the other contact pair is used for measuring a voltage. A relationship between the supplied current and the measured voltage defines the Van der Pauw transresistance value. The method furthermore comprises determining a stress signal which depends at least on the at least one Van der Pauw transresistance value, and determining the isotropic stress by comparing the determined stress signal with a predetermined reference stress signal which is temperature-dependent.

Using a 4-point measurement method as in accordance with embodiments of the present invention for determining the transresistance value is more accurate than using a simple resistance measurement. It is an advantage that a method according to embodiments of the present invention works irrespective of the shape of the Hall element, as long as it obeys the Van der Pauw requirements—thin plate, four or more contacts at the perimeter of the plate, contacts infinitesimally small. By determining the relative stress value, a distinction may be made between effects relating to temperature and effects relating to stress.

A method according to embodiments of the present invention may furthermore comprise calculating a sheet resistance value from the at least one van der Pauw transresistance value, and using the calculated sheet resistance for determining the stress signal.

Calculating the sheet resistance value from the at least one van der Pauw transresistance value may include solving the van der Pauw equation $$\exp\left(-\pi \frac{R_{vdp1}}{R_{sq}}\right) + \exp\left(-\pi \frac{R_{vdp2}}{R_{sq}}\right) = 1$$

or a mathematically equivalent relation which can be derived from this, possibly by using linear relations that exist between transresistance measurements, such as Van der Pauw transresistance measurements or diagonal transresistance measurements, performed on the Hall element.

In embodiments of the present invention, determining the isotropic stress may be based on determining from the calculated stress signal a relative stress signal according to $$V_{Srel} = \frac{V_S}{V_{S,ref}(T)},$$

wherein $V_{S,ref}(T)$ is a reference function for the stress signal, dependent on temperature T.

Alternatively, determining the isotropic stress may be based on determining from the calculated stress signal a relative stress signal according to $V_{Srel} = V_S - V_{S,ref}(T)$, wherein $V_{S,ref}(T)$ is a reference function for the stress signal, dependent on temperature T.

In embodiments of the present invention, determining at least one Van der Pauw transresistance value may include determining the at least one Van der Pauw transresistance value on a Hall element in which the contacts are respectively uniformly angularly displaced by 90°.

It is advantageous to use a symmetrical Hall element in which the contacts are uniformly angularly displaced by 90°. However, if for whatever reason the shape of the Hall element deviates from the optimal symmetrical shape, e.g. due to process variations, the general method for determining a stress value $V_s$ would be robust enough not to be substantially influenced thereby.

In embodiments of the present invention, determining at least one Van der Pauw transresistance value may comprise
  measuring a first Van der Pauw transresistance value in a first Van der Pauw measurement set-up wherein a first contact pair consisting of neighbouring contacts is used for supplying current and a second contact pair comprising neighbouring contacts is used for measuring a voltage, the second contact pair being different from the first contact pair and
  measuring a second Van der Pauw transresistance value in a second Van der Pauw measurement set-up wherein a third contact pair consisting of neighbouring contacts is used for supplying current and a fourth contact pair consisting of neighbouring contacts is used for measuring a voltage, the third contact pair being different from the first and the fourth contact pair and the fourth contact pair being different from the second contact pair, all contact pairs consisting of two out of the four contacts of the plate.

In alternative embodiments of the present invention, determining at least one Van der Pauw transresistance value may comprise
  measuring a first Van der Pauw transresistance value in a first Van der Pauw measurement set-up wherein a first contact pair consisting of neighbouring contacts is used for supplying current and a second contact pair consisting of neighbouring contacts is used for measuring a voltage, the second contact pair being different from the first contact pair, and
  measuring at least a first diagonal transresistance value in a first diagonal measurement set-up on the Hall element, a fifth contact pair being used for supplying a current and a sixth contact pair being used for measuring a voltage, the contacts of the fifth contact pair being interleaved along the edge of the quadrangle with the contacts of the sixth contact pair, all contact pairs consisting of two out of the four contacts of the plate, a relationship between the supplied current and the measured voltage defining the diagonal transresistance value, and
  calculating a second Van der Pauw transresistance value from the first Van der Pauw transresistance value and the at least first diagonal transresistance.

Measuring at least a first diagonal transresistance value may comprise measuring a first diagonal transresistance value in a first diagonal measurement set-up and
  measuring a second diagonal transresistance value in a second diagonal measurement set-up different from the first diagonal measurement set-up, and
  calculating a second Van der Pauw transresistance value may comprise calculating the second Van der Pauw transresistance value from the first Van der Pauw transresistance value and the sum or difference (depending on the sign convention used for the measurements), whereby the one applies that eliminates the magnetic field if it would be present) of the two diagonal transresistances.

In embodiments of the present invention, determining the stress signal which depends at least on the at least one Van der Pauw transresistance value may include taking the stress signal proportional to the sheet resistance value.

Alternatively, calculating the stress signal may include evaluating $V_S = \sqrt{V_{sq}^2 + \Gamma_1^2 V_{Offset}^2}$, wherein $V_s$ is the stress signal to be determined, $V_{sq}$ is the sheet resistance voltage proportional to the sheet resistance value, $\Gamma_1$ is a constant and $V_{offset}$ is a voltage proportional to the transresistance offset value which is linearly related to two diagonal transresistance measurements or to two Van der Pauw transresistance values.

Yet alternatively, calculating the stress signal may include evaluating $V_S = \sqrt{V_{sq}^2 + \Gamma_2^2 (\Delta V_W)^2}$, wherein $V_s$ is the stress signal to be determined, $V_{sq}$ is the sheet resistance voltage proportional to the sheet resistance value, $\Gamma_2$ is a constant and $\Delta V_W$ is a difference voltage over a first diagonal as a result from applying a current along the first diagonal and a voltage over a second diagonal as a result from applying a current along the second diagonal.

In embodiments of the present invention, determining a stress signal may comprise evaluating a signal proportional to an average value of the first and the second Van der Pauw transresistance values.

In embodiments of the present invention, determining a stress signal may comprise evaluating a linear function of a van der Pauw transresistance value and an offset value determined from at least one diagonal transresistance value.

Embodiments of the present invention also provide a method for determining a component of a magnetic field by means of a Hall element which has a plate-shaped area made of a doped semiconductor material and comprises four contacts contacting the plate-shaped area, the Hall element being located in the magnetic field. The method comprises
  determining the relative stress signal by means of the Hall element, according to any of the method embodiments of the first aspect of the present invention,
  calculating a Hall voltage value proportional to the magnetic field by adding a first diagonal voltage proportional to the first diagonal transresistance value and a second diagonal voltage proportional to the second diagonal transresistance value, and
  calculating the component of the magnetic field from the Hall voltage value, the relative stress signal, and a reference Hall voltage value.

Embodiments of the present invention also provide a method for determining a component of a magnetic field by means of a Hall element which has a plate-shaped area made of a doped semiconductor material and comprises four contacts contacting the plate-shaped area, the Hall element being located in the magnetic field. The method comprises
  determining the relative stress signal by means of the Hall element, according to any of the method embodiments of the first aspect of the present invention,
  measuring a current temperature of the Hall element,
  calculating a Hall voltage value proportional to the magnetic field by adding a first diagonal voltage proportional to the first diagonal transresistance value and a second diagonal voltage proportional to the second diagonal transresistance value,
  calculating the values of reference functions at the current temperature of the Hall element, and
  calculating the component of the magnetic field from the measured Hall voltage value, the stress signal, and the reference functions at the current temperature of the Hall element.

The reference functions may comprise a reference Hall function, a reference function for the stress signal and a reference function γ(T) dependent on material properties of the Hall element, wherein the parameter T denotes the temperature and wherein $h(V_{S,rel}(T), \gamma(T))$ denotes a function which depends on the relative stress signal $V_{S,rel}(T)$ and on the reference function γ(T), and wherein a value $D_{Out}$ is calculated for the component of the magnetic field according to the equation $$D_{Out} = \frac{V_{Hall}}{V_{Hall,ref}(T_a)} h(V_{S,rel}(T_a), \gamma(T_a)) B_{ref},$$

or an equation which is mathematically equivalent, wherein $B_{ref}$ is a reference magnetic field to which the function $V_{Hall,ref}(T)$ relates.

In particular embodiments, $h(V_{S,rel}(T), \gamma(T)) = h(V_S/V_{S,ref}(T), \gamma(T))$ and the value $D_{Out}$ is calculated for the component of the magnetic field according to the equation $$D_{Out} = \frac{V_{Hall}}{V_{Hall,ref}(T_a)} h(V_S/V_{S,ref}(T_a), \gamma(T_a)) B_{ref},$$

or an equation which is mathematically equivalent, wherein $B_{ref}$ is a reference magnetic field to which the function $V_{Hall,\,ref}(T)$ relates.

In particular embodiments, $$h(V_S/V_{S,ref}(T), \gamma(T)) = \frac{1}{1 - \gamma(T)\left(\frac{V_S}{V_{S,ref}(T)} - 1\right)},$$

with Vs the stress signal, Vs,ref(T) a reference function for the stress signal in function of temperature T, γ(T) a reference function dependent on material properties of the Hall element (1) in function of temperature T.

In alternative embodiments, $h(V_{S,rel}(T), \gamma(T)) = h(V_S - V_{S,ref}(T), \gamma(T))$ and the value $D_{Out}$ is calculated for the component of the magnetic field according to the equation $$D_{Out} = \frac{V_{Hall}}{V_{Hall,ref}(T_a)} h(V_S - V_{S,ref}(T_a), \gamma(T_a)) B_{ref},$$

or an equation which is mathematically equivalent, wherein $B_{ref}$ is a reference magnetic field to which the function $V_{Hall,\,ref}(T)$ relates.

In accordance with embodiments of the present invention, the reference functions $V_{Hall,ref}(T)$ and $V_{S,ref}(T)$ may be determined by means of a calibration, which comprises at least the following steps:

applying a reference magnetic field $B_{ref}$,
bringing the Hall element to various predetermined temperatures $T_i$, wherein the index i assumes values from 1 to n and n is an integer with n≥1,
for each temperature $T_i$:
measuring the temperature $T_{act}(i)$ of the Hall element,
measuring a first and a second diagonal voltage in the two diagonal measurement setups of the Hall element wherein the four contacts of the Hall element form a first and a second contact pair, the first contact pair being used for supplying a current and the second contact pair being used for measuring a voltage, the contacts of the first contact pair being interleaved along the edge of the quadrangle with the contacts of the second contact pair, the first diagonal measurement set-up being different from the second diagonal measurement set-up, and calculating a Hall voltage value $V_{Hall,ref}(i)$;
measuring at least one van der Pauw transresistance value $R_{vdP}(i)$ in at least one van der Pauw measurement setup of the Hall element wherein the four contacts of the Hall element form a third and a fourth contact pair, the third contact pair consisting of neighbouring contacts and being used for supplying a current and the fourth contact pair consisting of neighbouring contacts and being used for measuring a voltage, the third contact pair being different from the fourth contact pair, a relationship between the supplied current and the measured voltage defining the Van der Pauw transresistance value;
calculating a stress voltage $V_{S,ref}(i)$;
and then
determining the reference function $V_{Hall,\,ref}(T)$ from the data sets $\{T_{act}(i), V_{Hall,\,ref}(i)\}$; and
determining the reference function $V_{S,\,ref}(T)$ from the data sets $\{T_{act}(i), V_{S,\,ref}(i)\}$.

In a method according to embodiments of the present invention, first data sets $\{T_{act}(i), V_{Hall,\,ref}(i), V_{S,\,ref}(i)\}$ may be determined for a first stress condition of the Hall element for various temperatures $T_i$ with i=1 to n, and second data sets $\{T_{act}(k), V_{Hall,\,sec}(k), V_{S,\,sec}(k)\}$ may be determined for a second stress condition of the Hall element for various temperatures $T_k$ with k=1 to h, wherein n and h are integers with n≥1 and h≥1. The reference functions $V_{Hall,\,ref}(T)$ and $V_{S,\,ref}(T)$ may be determined from the first data sets and reference functions $V_{Hall,\,sec}(T)$ and $V_{S,\,sec}(T)$ may be determined from the second data sets, and the reference function γ(T) may be determined as $$\gamma(T) = \frac{\frac{V_{Hall,sec}(T)}{V_{Hall,ref}(T)} \frac{B_{ref}}{B_{sec}} - 1}{1 - \frac{V_{S,sec}(T)}{V_{S,ref}(T)}},$$

wherein the value $B_{ref}$ denotes the magnetic field applied when determining the first data sets and the value $B_{sec}$ denotes a magnetic field applied when determining the second data sets.

In a further aspect, embodiments of the present invention provide a stress sensor for measuring isotropic stress. The stress sensor comprises a Hall element which has a plate-shaped area made of a doped semiconductor material and comprises four contacts contacting the plate-shaped area. The contacts form corners of a quadrangle. Two neighbouring corners of the quadrangle define an edge thereof. The stress sensor furthermore comprises a switching matrix, a current source for supplying a current, a differential amplifier for measuring a voltage generated by means of the supplied current, and a microcontroller. The switching matrix is arranged to operate the Hall element in at least one van der Pauw measurement setup wherein the four contacts of the Hall element form two different contact pairs, a contact pair consisting of neighbouring contacts, one contact pair being used for supplying a current and the other contact pair being used for measuring a voltage. The switching matrix is furthermore also arranged to operate the Hall element in two resistance measurement setups wherein four contacts of the Hall element form two contact pairs, a contact pair consisting of two contacts which are not neighbouring contacts of the quadrangle, a contact pair in a resistance measurement setup being used for supplying a current and for measuring a voltage. The microcontroller is arranged to generate a stress signal for isotropic stress from measured values of the various measurement setups.

Embodiments of the present invention also provide a Hall sensor for measuring a component of a magnetic field. The Hall sensor comprises a Hall element which has a plate-shaped area made of a doped semiconductor material and comprises four contacts contacting the plate-shaped area, the contacts forming corners of a quadrangle, two neighbouring corners of the quadrangle defining an edge thereof. The Hall sensor furthermore comprises a switching matrix, a current source for supplying a current, a differential amplifier for measuring a voltage generated by the supplied current, and a microcontroller. The switching matrix is arranged to operate the Hall element in two orthogonal diagonal measurement setups wherein the four contacts of the Hall element form two contact pairs, a contact pair consisting of two contacts which are not neighbouring contacts of the quadrangle. One contact pair is used for supplying a current and the other contact pair is used for measuring a voltage. The two diagonal measurement setups are different from one another. The switching matrix is also arranged to operate the Hall element in at least one van der Pauw measurement setup wherein the four contacts of the Hall element form two different contact pairs, a contact pair consisting of neighbouring contacts, one contact pair being used for supplying a current and the other contact pair being used for measuring a voltage. The switching matrix is furthermore arranged to operate the Hall element in two resistance measurement setups wherein four contacts of the Hall element form two contact pairs, a contact pair consisting of two contacts which are not neighbouring contacts of the quadrangle, a contact pair in a resistance measurement setup being used for supplying a current and for measuring a voltage. The microcontroller is arranged to generate a stress- and temperature-compensated output signal for the component of the magnetic field from measured values of the various measurement setups.

A sensor according to embodiments of the present invention may be adapted for sequentially determining the measured values of the various measurement setups from a single Hall element.

Alternatively, a sensor according to embodiments of the present invention may comprise a plurality of Hall elements on a same chip, each Hall element having a plate-shaped area made of a doped semiconductor material and four contacts contacting the plate-shaped area, the contacts of a Hall element forming corners of a quadrangle, two neighbouring corners of the quadrangle defining an edge thereof. The Hall elements furthermore each comprise a switching matrix, a current source for supplying a current, and a differential amplifier for measuring a voltage generated by the supplied current. The plurality of Hall elements have a microcontroller. The sensor may be adapted for simultaneously determining the measured values of the various measurement set-ups. In particular embodiments, the sensor may be adapted for simultaneously determining at least two orthogonal diagonal measurements and/or at least one Van der Pauw transresistance measurement from different Hall elements.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
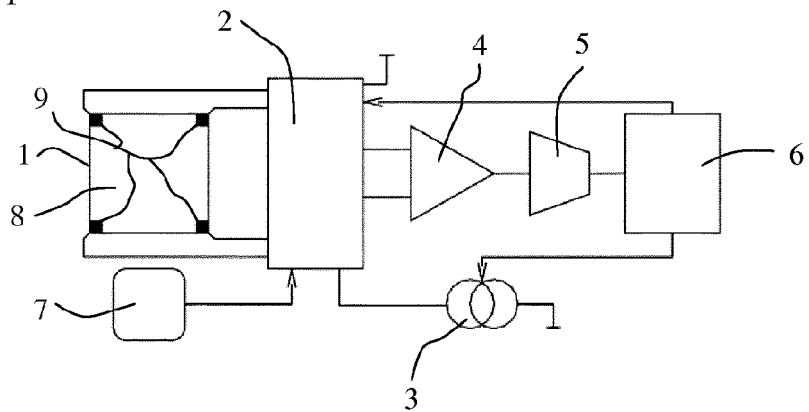
FIG. 1 shows an embodiment of a Hall sensor which has a Hall element and which is integrated into a semiconductor chip.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination, unless otherwise indicated.

It should be noted that the use of particular terminology when describing certain features or aspects of the invention should not be taken to imply that the terminology is being re-defined herein to be restricted to include any specific characteristics of the features or aspects of the invention with which that terminology is associated.

The Van der Pauw method is a known method for very accurately determining the resistivity of a material.

A Van der Pauw measurement set-up of a Hall element is a set-up wherein a Hall element has a plate-shaped area made of a doped semiconductor material, and comprises four contacts contacting the plate-shaped area, preferably at or close to its perimeter. The contacts form corners of a quadrangle, two neighbouring corners of a quadrangle defining an edge thereof. Stated in other words: each edge of the quadrangle is associated with two corners defining the end points of that edge, and each corner of the quadrangle is associated with two edges the intersection of which defines the corner. In the Van der Pauw measurement set-up, the four contacts of the Hall element form two disjunct contact pairs, each of these contact pairs consisting of two contacts which are neighbouring corners of the quadrangle. In the Van der Pauw measurement set-up, one contact pair is used for supplying a current and the other contact pair is used for measuring a voltage.

A measurement of a voltage between the contacts of one contact pair on such set-up wherein a known current is applied between the contacts of another contact pair is called a Van der Pauw measurement.

The measured voltage is called a Van der Pauw voltage. A relationship according to Ohm's law between the known applied current and the measured Van der Pauw voltage defines the Van der Pauw transresistance value.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention relates to a plate-like structure of doped material with (at least) four contacts, such as for instance (1) an integrated Hall element, or (2) a "Van der Pauw" structure used for the purpose of stress sensing. While the structures involved are quite similar, some distinction between them can be made. In the case of the Hall element, a magnetic field is present, and the plate is designed in such a way that its sensitivity w.r.t. this magnetic field is large. The presence of mechanical stress is an unwanted source of error (described later). In contrast, the Van der Pauw stress sensor has precisely the purpose of sensing stress, while magnetic fields may be considered an unwanted source of error.

The present invention, although not intended to be limited thereto, is described in detail below by means of a Hall sensor. The Hall sensor is integrated into the active surface of a semiconductor chip and may be manufactured, for example, using CMOS technology. In this example, the Hall element is also integrated into the semiconductor chip.

Mechanical stress is not a one-dimensional parameter. The stress-state of a material at any point is actually described by six independent components. "Normal stress components" ($\sigma_{xx}$, $\sigma_{yy}$ and $\sigma_{zz}$; based on the designations these are normal mechanical stress components along the x-, y- or z-axis) and "shear stress components" ($\sigma_{xy}$, $\sigma_{xz}$ and $\sigma_{yz}$) can be identified. The precise stress state occurring in the Hall element depends mainly on "external" forces exerted on the electronic die. For Hall elements, an important source of stress comes from forces exerted by the package. This is because for cost-reasons moulded plastic packages are used, and the different thermal expansion of the package relative to the die generates large forces. Unfortunately, the generated forces and hence resulting stresses are not only temperature-dependent, but also depend on other environmental conditions such as for instance humidity. Furthermore, they also change with time due to aging. These drift-effects ultimately limit the accuracy of a Hall sensor with only temperature-compensation, which is the main motivation for, in accordance with embodiments of the present invention, adding stress-compensation to Hall sensors.

It is generally known that mechanical stress changes the electric behaviour of the plate material. The following distinctions are typically made:

Piezo-resistive effect=the change of resistivity at some point of the Hall element due to stress Piezo-Hall effect=the change of Hall-sensitivity at some point of the Hall element due to stress The following stress components particularly have an influence on the sensitivity and/or the resistivity of the Hall element:

| | |
|---|---|
| $\sigma_{iso} = \sigma_{xx} + \sigma_{yy}$ | referred to as isotropic stress |
| $\sigma_{diff} = \sigma_{xx} - \sigma_{yy}$ | referred to as differential stress |
| $\sigma_{xy}$ | referred to as shear stress | whereby it is assumed here that the Hall element lies in the x-y plane and the edges of the semiconductor chip run parallel to the x-axis or y-axis. In addition, the following designations are used below:

| | |
|---|---|
| $\pi_{11}, \pi_{12}, \pi_{44}$ | piezo-resistive coefficients associated with the primary crystal axes |
| $\Pi_{11}, \Pi_{12}, \Pi_{13}, \Pi_{66}$ | piezo-resistive coefficients adjusted via a tensor operation on the rotational position of the edges of the semiconductor chip with respect to the crystal axes of the wafer |
| $P_{11}, P_{12}, P_{44}$ | piezo-electric coefficients associated with the primary crystal axes |
| T | the temperature |
| $T_a$ | the current temperature of the Hall element |
| $\rho_0(T)$ | the zero-stress isotropic resistivity of the Hall element, which is the resistivity of the Hall element as a function of the temperature in a stress-free state |
| d | an average thickness of the Hall element |
| $\mu_H$ | the Hall mobility |
| $\epsilon_H$ | piezo-Hall effect |
| $\epsilon_I$ | piezo-resistivity due to isotropic stress $\sigma_{iso}$ |
| $\epsilon_D$ | piezo-resistivity due to differential (anisotropic) stress $\sigma_{diff}$ |
| $\epsilon_\tau$ | piezo-resistivity due to shear stress $\sigma_{xy}$ |

Derived values specify how $\epsilon_H$, $\epsilon_I$ and $\epsilon_D$ depend on the individual components. Due to the crystal structure, the expressions depend on the orientation of the plate of the Hall element with respect to the crystal axes. Expressions for a plate in a general orientation can be derived with straightforward, but rather tedious tensor transformations, and are of the form:

$$\varepsilon_H = P_{12}\sigma_{iso} + P_{11}\sigma_{zz}$$

$$\varepsilon_I = \frac{\Pi_{11} + \Pi_{12}}{2}\sigma_{iso} + \Pi_{13}\sigma_{zz}$$

$$\varepsilon_D = \frac{\Pi_{11} - \Pi_{12}}{2}\sigma_{diff}$$

$$\varepsilon_T = \Pi_{66}\sigma_{xy}$$

In the following, for reasons of simplicity only, the formulae are limited to the most frequently occurring situation: a plate on a (100) wafer with <101> flat. The following formulae are obtained:

$$\varepsilon_H = P_{12}\sigma_{iso} + P_{11}\sigma_{zz} \quad (1)$$

$$\varepsilon_I = \frac{\pi_{11} + \pi_{12}}{2}\sigma_{iso} + \pi_{12}\sigma_{zz} \quad (2)$$

$$\varepsilon_D = \frac{\pi_{44}}{2}\sigma_{diff} \quad (3)$$

$$\varepsilon_\tau = (\pi_{11} - \pi_{12})\sigma_{xy} \quad (4)$$

The actual values for $\pi_{11}$, $\pi_{12}$, $\pi_{44}$ and $P_{11}$, $P_{12}$, $P_{44}$ depend on technological parameters such as the doping level of the plate. Representative numeric values can be found in literature.

Mathematically, the local electric behaviour at some point of the plate of the Hall element is described by a kind of "generalized Ohm's law" E=ρJ which relates the electric field E with the current density J. Due to the crystal structure of the plate material, the electrical behaviour of the Hall element is anisotropic (i.e. direction-dependent), which is modelled by ρ being a matrix. In its most general form, ρ is a 3×3 matrix. However, in a horizontal Hall element the current-flow and electric field can be assumed to be in-plane (i.e. it can be assumed that $E_z=J_z=0$), and the anisotropic resistivity of the Hall element can be described by a 2×2 matrix. Taking into account now a magnetic field B perpendicular to the Hall element, it can be shown that ρ takes the form:

$$\begin{bmatrix} \rho_{xx} & \rho_{xy} \\ \rho_{yx} & \rho_{yy} \end{bmatrix} = \rho_0(T) \begin{bmatrix} 1 + \varepsilon_I + \varepsilon_D & \varepsilon_\tau + (1 + \varepsilon_H)\mu_H B \\ \varepsilon_\tau - (1 + \varepsilon_H)\mu_H B & 1 + \varepsilon_I - \varepsilon_D \end{bmatrix} \quad (5)$$

The method for determining isotropic stress and the stress-compensation principle according to embodiments of the present invention are now explained in terms of the above formulae.

In first instance, for simplicity reasons, the out-of-plane normal stress $\sigma_{zz}$ is assumed to be zero. First, from equation (5) it can be seen that stress scales the expected magnetic contribution "$\mu_H B$" with a factor $(1+\epsilon_H)$. This factor therefore represents the piezo-Hall effect. In order to compensate for it, this factor needs to be estimated. From equation (1), it can be seen that $\epsilon_H$ depends only on isotropic stress $\sigma_{iso}$ (the out-of-plane normal stress $\sigma_{zz}$ is still assumed to be zero). Referring again to equation (5), three piezo-resistive effects are noticed, represented by $\epsilon_I$, $\epsilon_D$ and $\epsilon_\tau$ respectively. Suppose now that a resistive measurement which provides a value for $\epsilon_I$ can be thought of. Identifying a usable resistive measurement to extract $\epsilon_I$ in accordance with embodiments of the present invention will be discussed hereinbelow. With a value available for $\epsilon_I$, equation (2) allows to estimate from this the isotropic stress $\sigma_{iso}$, which can be used to estimate $\epsilon_H$ with equation (1). This leads to the following expression:

$$\varepsilon_H = -\alpha \cdot \varepsilon_I \text{ with } \alpha = -\frac{2P_{12}}{\pi_{11} + \pi_{12}} \quad (6)$$

Therefore, when the ratio of material constants $$\frac{2P_{12}}{\pi_{11} + \pi_{12}}$$

is known, the piezo-Hall factor $(1+\epsilon_H)$ can be calculated from a measured $\epsilon_I$ value, and hence based thereon, a compensation for the piezo-Hall effect can be obtained.

It turns out, due to a numerical coincidence between the piezo-constants involved, that equation (6) is still approximately valid when the out-of-plane normal stress is non-zero. This can be illustrated as follows. Re-arranging equations (1) and (2) gives:

$$\epsilon_H = P_{12}\left\{\sigma_{iso} + \frac{P_{11}}{P_{12}}\sigma_{zz}\right\}$$

$$\epsilon_I = \frac{\pi_{11} + \pi_{12}}{2}\left\{\sigma_{iso} + \frac{2\pi_{12}}{\pi_{11} + \pi_{12}}\sigma_{zz}\right\}$$

Using numerical values, it can be shown that $$\frac{P_{11}}{P_{12}} \approx \frac{2\pi_{12}}{\pi_{11}+\pi_{12}},$$

which then implies that equation (6) indeed remains valid.

From the above, it can be seen that if a method is provided which leads to a measure of $\epsilon_I$, equation (6) can be sued to derive therefrom a means to compensate the piezo-Hall effect.

I. Measurement Setup

A stress sensor according to embodiments of the present invention comprises a measuring element, an electronic circuit having the components which are required for performing measurements on the measuring element and a microcontroller. The stress sensor may optionally also comprise a temperature sensor. The stress sensor can, for example, be used as a pressure sensor.

The electronic circuit and the microcontroller may be integrated into a semiconductor chip. The measuring element of the stress sensor is a plate-shaped element which has the same structure as a horizontal Hall element of a Hall sensor. The measuring element of the stress sensor is thus effectively a Hall element. To avoid duplication, the invention is explained below using a Hall sensor, thus allowing everything to be transferred to one stress sensor according to embodiments of the invention, in which the Hall element is the plate-shaped measuring element. The Hall element is also typically integrated into the semiconductor chip, but can also be a stand-alone, discrete Hall element.

A Hall sensor according to embodiments of the invention, similarly as the more general stress sensor, comprises a Hall element as the measuring element, an electronic circuit having the components which are required for performing measurements on the Hall element, a microcontroller and optionally a temperature sensor. The Hall element is a so-called horizontal Hall element and comprises four contacts which may be, but do not need to be, respectively uniformly angularly displaced by 90°. The Hall element is used to measure the isotropic stress and to measure the component of the magnetic field which runs perpendicular to its active surface.

FIG. 1 shows the block diagram of such a Hall sensor. The illustrated Hall sensor comprises a Hall element 1, a switching matrix 2, a current source 3, a differential amplifier 4, an analog-to-digital converter 5, a microcontroller 6 and optionally a temperature sensor 7. The Hall element 1 is a so-called horizontal Hall element, which is sensitive to the component of the magnetic field running perpendicular to the active surface of the semiconductor chip. The current source 3 is a controlled direct-current constant current source whose current strength I can be adjusted by the microcontroller 6. It has a negative terminal and a positive terminal. The differential amplifier 4 has a negative input and a positive input. The microcontroller 6 controls the various components of the Hall sensor and contains programming code and calibration data for calculating the strength of the magnetic field component.

The Hall element 1 has a plate-shaped area made of a doped semiconductor material and comprises four contacts 9 which contact the area and are located at or near the edge of the plate. Such a plate-like structure is a realization of an idealized Van der Pauw structure, which is a flat structure with uniform thickness d (without isolated holes), which provides four point-like contacts located on the edge of the plate. In many cases, the plate and contacts are designed such that the whole is symmetric w.r.t. a rotation over 90°. However, because of various process-limitations the actually realized structure may deviate from such an ideal configuration, e.g. because of mask misalignments, non-symmetric diffusion, etc.

In an integrated embodiment, the plate-shaped area is a well 8 of a first conductivity type, which is embedded in an area of a second conductivity type. The Hall element 1 may be designed to be (as much as possible) invariant under 90° rotations with respect to a symmetry point; however, this is not intended to be limiting for the present invention. The four contacts 9 form the corners of a quadrangle. Corners of the quadrangle are defined as being "neighbouring" if they for an edge of the quadrangle. The well 8 is preferably square and the four contacts 9 are preferably arranged in the corners of the square. The well 8 can also be cross-shaped and the contacts 9 can be arranged on the ends of the arms of the cross.

The switching matrix 2 serves to connect two contacts 9 of the Hall element 1 to the current source 3 and the two other contacts 9 to the differential amplifier 4. Six different switching states are provided, which are illustrated in FIGS. 2A to F. Short arrows illustrate the current direction, and long dashed arrows together with the symbols + and − illustrate the polarity of the voltage with respect to the inputs of the differential amplifier 4. Of course, other polarities can be used, which may change signs in calculations below, as will be appreciated by the skilled reader.

The method according to the invention will now be described in detail by means of a preferred embodiment in which the measurements are performed by supplying a known current which is provided by the current source 3 and by measuring voltages by means of the differential amplifier 4. In order to be able to combine the various measured voltages as described in the equations below, the voltages must relate to the same current I. In other words, the current source 3 either provides the same current I for all measurements of the various voltages in switching states 1 to 6, or the measured voltages are scaled such that they relate to an identical current I.

Figure 2A:
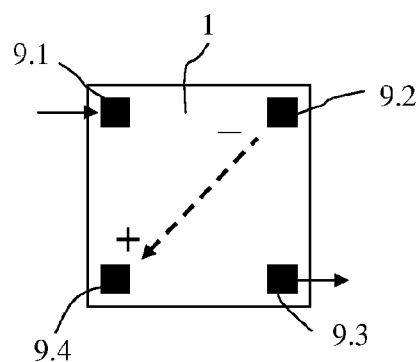
FIGS. 2A to 2F show various circuit diagrams for measuring Hall voltages, van der Pauw voltages and internal resistances of the Hall element.

Switching State 1=Diagonal Measurement Setup 1 (FIG. 2A)

The non-neighbouring contacts, e.g. diametrically opposed contacts, 9.1 and 9.3 are connected to the current source 3, and the non-neighbouring contacts, e.g. diametrically opposed contacts 9.2 and 9.4 are connected to the differential amplifier 4. The current flows from the positive terminal of the current source 3 to the contact 9.1 and from the contact 9.3 to the negative terminal of the current source 3, as indicated by arrows. The contact 9.2 is connected to the negative input of the differential amplifier 4, and the contact 9.4 is connected to the positive input of the differential amplifier 4. The voltage present at the differential amplifier 4 in this state is referred to as the diagonal voltage $V_{diag1}$, and by relating the measured diagonal voltage to the known current I, the first diagonal transresistance $R_{diag1}$ may be obtained.

Figure 2B:
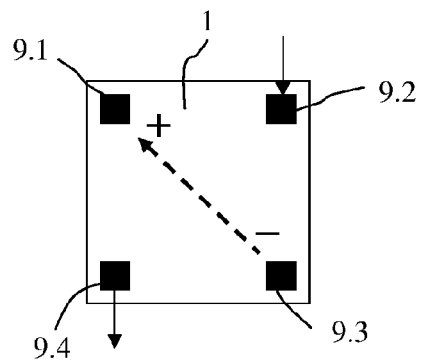

Switching State 2=Diagonal Measurement Setup 2 (FIG. 2B)

The non-neighbouring contacts, e.g. diametrically opposed, contacts 9.2 and 9.4 are connected to the current source 3, and the non-neighbouring contacts, e.g. diametrically opposed contacts, 9.3 and 9.1 are connected to the differential amplifier 4. The current flows from the positive terminal of the current source 3 to the contact 9.2 and from the contact 9.4 to the negative terminal of the current source 3. The contact 9.3 is connected to the negative input of the differential amplifier 4, and the contact 9.1 is connected to the positive input of the differential amplifier 4. The voltage present at the differential amplifier 4 in this state is referred to as the diagonal voltage $V_{diag2}$.

The two switching states 1 and 2 are the well-known orthogonal positions when operating a Hall element using the spinning current method; that is, they are distinguished by a rotation of the Hall element by 90°. The first diagonal voltage $V_{diag1}$ and the second diagonal voltage $V_{diag2}$ are normally referred to as Hall voltage $V_{Hall1}$ and Hall voltage $V_{Hall2}$. By relating the first diagonal voltage Vdiag1 and the second diagonal voltage $V_{diag2}$ to the known current I, the first diagonal transresistance $R_{diag1}$ and the second diagonal transresistance $R_{diag2}$ may be obtained.

Figure 2C:
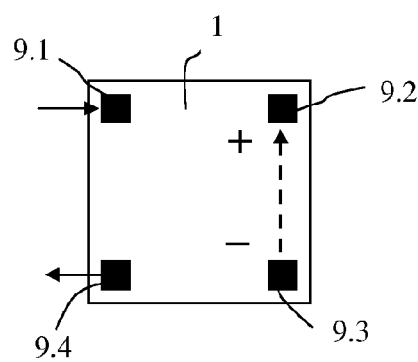

Switching State 3=Van Der Pauw Measurement Setup 1 (FIG. 2C)

The neighbouring or adjacent contacts 9.1 and 9.4 are connected to the current source 3, and the neighbouring or adjacent contacts 9.2 and 9.3 are connected to the differential amplifier 4. The current flows from the positive terminal of the current source 3 to the contact 9.1 and from the contact 9.4 to the negative terminal of the current source 3. The contact 9.2 is connected to the negative input of the differential amplifier 4, and the contact 9.3 is connected to the positive input of the differential amplifier 4. The voltage present at the differential amplifier 4 in this state is referred to as the van der Pauw voltage $V_{vdP1}$. By relating this first Van der Pauw voltage $V_{vdP1}$ to the known current I, the first Van der Pauw transresistance $R_{VdP1}$ may be obtained.

Figure 2D:
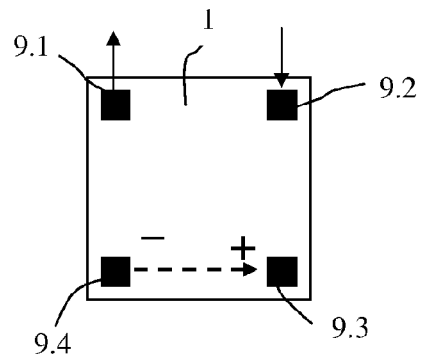

Switching State 4=Van Der Pauw Measurement Setup 2 (FIG. 2D)

The neighbouring or adjacent contacts 9.1 and 9.2 are connected to the current source 3, and the neighbouring or adjacent contacts 9.4 and 9.3 are connected to the differential amplifier 4. The current flows from the positive terminal of the current source 3 to the contact 9.2 and from the contact 9.1 to the negative terminal of the current source 3. The contact 9.3 is connected to the negative input of the differential amplifier 4, and the contact 9.4 is connected to the positive input of the differential amplifier 4. The voltage present at the differential amplifier 4 in this state is referred to as the van der Pauw voltage $V_{vdP2}$. By relating this second Van der Pauw voltage $V_{vdP2}$ to the known current I, the second Van der Pauw transresistance $R_{VdP2}$ may be obtained.

The switching state 3 and the switching state 4 are distinguished by a rotation of the Hall element by 90°; that is, they are also orthogonal to each other.

Figure 2E:
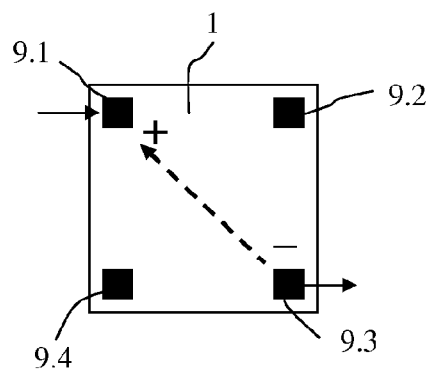

Switching State 5=Resistance Measurement Setup 1 (FIG. 2E)

The non-neighbouring contacts, e.g. diametrically opposed, contacts 9.1 and 9.3 are connected to both the current source 3 and the differential amplifier 4. The current flows from the positive terminal of the current source 3 to the contact 9.1 and from the contact 9.3 to the negative terminal of the current source 3. The contact 9.1 is connected to the positive input of the differential amplifier 4, and the contact 9.3 is connected to the negative input of the differential amplifier 4. The voltage present at the differential amplifier 4 in this state is referred to as the voltage drop $V_{W1}$. By relating this first voltage drop $V_{W1}$ to the known current I, the first resistance drop $R_{W1}$ may be obtained.

Figure 2F:
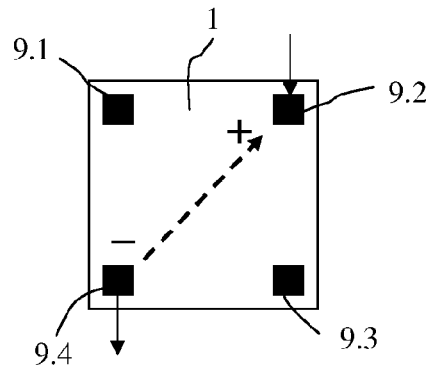

Switching State 6=Resistance Measurement Setup 2 (FIG. 2F)

The non-neighbouring contacts, e.g. diametrically opposed, contacts 9.2 and 9.4 are connected to both the current source 3 and the differential amplifier 4. The current flows from the positive terminal of the current source 3 to the contact 9.2 and from the contact 9.4 to the negative terminal of the current source 3. The contact 9.2 is connected to the positive input of the differential amplifier 4, and the contact 9.4 is connected to the negative input of the differential amplifier 4. The voltage present at the differential amplifier 4 in this state is referred to as the voltage drop $V_{W2}$. By relating this second voltage drop $V_{W2}$ to the known current I, the second resistance drop $R_{W2}$ may be obtained.

The switching state 5 and the switching state 6 are distinguished by a rotation of the Hall element by 90°; that is, they are also orthogonal to each other.

The set-up and corresponding method according to embodiments of the invention can be modified such that the current source 3 is replaced by a voltage source in the switching states 1 to 6. In this case, for example, an ammeter is arranged in series with the voltage source, which measures the current provided by the voltage source. A resistance is calculated from the ratio of the voltage present at the differential amplifier 4 and the current measured using the ammeter. The resistance can be multiplied by a predetermined current I in order to obtain a normalized voltage for all measurements which relates to the identical current I and which can be used for the calculations described below.

The voltages measured by the differential amplifier 4 may be digitized by means of the analog-to-digital converter 5 and can then be used in the microcontroller 6 to calculate a stress signal for the isotropic stress of the stress sensor and optionally to calculate a stress- and/or temperature-compensated output signal of the Hall sensor.

Since the resistance voltages $V_{W1}$ and $V_{W2}$ of switching states 5 and 6 typically have relatively large values, it may be advantageous to arrange an additional circuit between the switching matrix 2 and the differential amplifier 4 which generates the difference of the two resistance voltages $V_{W1}$ and $V_{W2}$ in an analogue manner, so that the differential resistance voltage ΔVw is supplied to the differential amplifier 4 for amplification. Such an additional circuit can, for example, be implemented using switched capacitor technology.

II. Generating the Stress Signal for the Isotropic Stress

According to embodiments of the present invention, a stress signal is determined which depends at least one the at least one Van der Pauw transresistance value.

According to particular embodiments of the present invention, determining the stress signal may comprise the determination of a sheet resistance value taking into consideration two Van der Pauw transresistance values, of which at least one is measured and the second one may be either measured or calculated. This determined sheet resistance value may then be used for determining the stress signal. This method will be explained below in more detail. However, in accordance with other embodiments of the present invention it is not absolutely required to actually calculate the sheet resistance value, and other calculation methods for determining the stress signal without actually calculating the sheet resistance value also form part of the present invention.

The sheet resistance value can typically be represented as the sheet resistance value $R_{sq}$. The corresponding sheet resistance voltage $V_{sq}$ may be used as a measure for the sheet resistance value $R_{sq}$, the link between both being expressed by Ohm's law $V_{sq}=R_{sq}*I$ in which the value I denotes the current that was used for measuring the Van der Pauw voltage $V_{Vdp}$.

The stress signal can be generated based on resistances as well as voltages. Since a voltage value can be converted into a resistance value by dividing by a specific current, the generation of the stress signal is explained below by means of resistances. This, however, is not intended to be limiting for the present invention. A similar reasoning based on corresponding voltages could also be made.

A) Calculation of the Sheet Resistance $R_{sq}$ of the Hall Element 1

Van der Pauw has proven that, irrespective of the shape of the structure and the location of the contacts on the edge, the sheet resistance $R_{sq}$ of the material can be extracted by solving the nonlinear equation:

$$\exp\left(-\pi \frac{R_{vdp1}}{R_{sq}}\right) + \exp\left(-\pi \frac{R_{vdp2}}{R_{sq}}\right) = 1 \qquad (7)$$

or a mathematically equivalent relation which can be derived from this, as shown below. In this, $R_{vdP1}$ and $R_{vdp2}$ will be referred to as Van der Pauw measurement.

For a square plate, these are shown in FIG. 2C and FIG. 2D. Technically, these are transresistance measurements, because excitation and sensing is not at the same nodes. Deriving $R_{sq}$ from these two transresistance measurements will be referred to as applying the Van der Pauw method.

The present inventors have found that $\epsilon_l$ can be extracted from the sheet resistance $R_{sq}$ obtained from applying the Van der Pauw method.

To explain this, it is first predicted theoretically what information is contained within the sheet resistance $R_{sq}$. For this purpose, the results of R. T. H. Shibata, "A potential problem for point contacts on a two-dimensional anisotropic medium with an arbitrary resistivity tensor," J. Appl. Phys., vol. 66, no. 10, November 1989, further called Shibata89, are used, which contains a study of the Van der Pauw method applied to anisotropic material and in the presence of a magnetic field, to obtain:

$$R_{sq} = \frac{1}{d}\sqrt{\rho_{xx}\rho_{yy} - \left(\frac{\rho_{xy} + \rho_{yx}}{2}\right)^2}$$

Combining this with the above equation (5), this leads to $$R_{sq} = \frac{\rho_0(T)}{d}\sqrt{(1+\epsilon_l)^2 - \epsilon_D^2 + \epsilon_t^2} \qquad (8)$$

In this, the factor $$\frac{\rho_0(T)}{d}$$

in front can be interpreted as the sheet resistance at zero stress. This zero-stress sheet resistance depends on temperature, mainly because the resistivity of the plate changes with temperature. From the $R_{sq}$ expression (8), it is clear that both differential stress (represented by $\epsilon_D$) and shear stress (represented by $\epsilon_t$) only have a second-order influence on $R_{sq}$. Furthermore, equation (8) has been derived assuming the presence of a magnetic field, and therefore proves that the derived sheet resistance $R_{sq}$ does not depend on the magnetic field, which is an important element when the method is applied for compensation in Hall sensors.

Below, it will be shown that the second-order dependency of $R_{sq}$ on differential and shear stress can be compensated, leading to a measurement which is provably proportional to $1+\epsilon_l$. For this purpose, additional measurements may be used.

In order to solve equation (7), two Van der Pauw transresistance values $R_{vdp1}$ and $R_{vdp2}$ are required.

In a first embodiment, these two Van der Pauw transresistance values $R_{vdp1}$ and $R_{vdp2}$ may both be measured in a Van der Pauw measurement set-up as described above, with respect to switching state 3 (FIG. 2C) and switching state 4 (FIG. 2D).

The inventors have found that it can be derived from L. J. van der Pauw, "A method of measuring specific resistivity and Hall effect of discs of arbitrary shape," Philips Research Reports, vol. 13, no. 1, 1958, further called VanDerPauw58, for isotropic material, or from Shibata89 for anisotropic material, that the two "Van der Pauw measurements" and the offset measurement are linearly related:

$$R_{vdp2} - R_{vdp1} = R_{offset} \qquad (9)$$

Hence the transresistance offset value $R_{offset}$ can be directly determined if two Van der Pauw transresistance measurements $R_{Vdp1}$ and $R_{Vdp2}$ are available.

In a second embodiment, a single Van der Pauw measurement may be performed so as to obtain a first Van der Pauw transresistance value $R_{vdp1}$, provided that also an offset measurement is available so as to enable calculation of a second Van der Pauw transresistance value $R_{vdp2}$.

In the absence of a magnetic field, the offset can be measured "along the diagonals" by one of the two possibilities shown in FIG. 2A or FIG. 2B. Here, a known current I is applied along one diagonal, and the voltage is measured along the other diagonal. By determining the ratio of measured voltage and known current, the result can be expressed as a resistance. In this case, it can also be shown that because of reciprocity $R_{offset} = R_{diag1} = -R_{diag2}$ (the minus sign is due the sign conventions used in the figures). In this case it is sufficient to measure only one of the diagonal transresistances on top of one Van der Pauw measurement.

In case a magnetic field is present, as is the case for a Hall sensor, both diagonal measurements shown in the figure are used. The transresistance Hall readout (relating the Hall voltage with the known current) is then obtained as $$R_{Hall} = \frac{R_{diag1} + R_{diag2}}{2}$$

while the offset transresistance is given by $$R_{offset} = \frac{R_{diag1} - R_{diag2}}{2}$$

The signs in these expressions depend on sign conventions used when applying currents and measuring voltages, and are such that in $R_{Hall}$ the offset drops out and the component proportional to the magnetic field remains (i.e. the spinning current average), while in $R_{offset}$ the contribution from the magnetic field drops out.

An important element now is that the two "Van der Pauw measurements" and the offset measurements are linearly related—see also equation (9):

$$R_{vdp2} - R_{vdp1} = R_{offset}$$

For the case of isotropic material and without a magnetic field, this result goes back to the original work VanDerPauw58. For anisotropic materials in a nonzero magnetic field, it can be derived from Shibata89.

Relation (9) allows to replace the second Van der Pauw transresistance measurement $R_{vdp2}$ with an offset measurement $R_{offset}$ which may be obtained by measuring diagonal voltage (or thus diagonal transresistances). Indeed, when introducing the average of the two Van der Pauw transresistance measurements:

$$R_{vdp} = \frac{R_{vdp1} + R_{vpd2}}{2}$$

Then equation (9) shows that $R_{vdp2}=R_{vdp1}+R_{offset}$, and hence $$R_{vdp} = R_{vdp1} + \frac{R_{offset}}{2}$$

Likewise, it can be shown that $$R_{vdp} = R_{vdp2} - \frac{R_{offset}}{2}$$

Both previous results indicate that a single Van der Pauw measurement is sufficient, when it is combined with an offset measurement. This result not only applies to the linear Van der Pauw method, but also to the nonlinear Van der Pauw method.

In a particular case when only stress-measurements are targeted, it can be assumed that the magnetic field is zero. Then, a single Van der Pauw measurement with on top thereof one diagonal offset measurement is sufficient to extract the isotropic stress signal.

In case the magnetic field is non-zero, also a single Van der Pauw measurement is sufficient, but two diagonal measurements are needed to eliminate the magnetic field component.

It is advantageous to use only a single Van der Pauw measurement, as this improves, e.g. maximizes, the sensor bandwidth. In a Hall system, it reduces, e.g. minimizes, the interruption of the normal readout operations.

Furthermore, the accuracy of an offset measurement is higher, because much smaller signals are involved.

Moreover, in a Hall system the offset measurements are obtained nearly "for free" due to spinning-current operation. This means that in a time-multiplexed readout scheme no separate readout phases are needed for $R_{offset}$.

The diagonal transresistance values $R_{diag1}$ and $R_{diag2}$, the transresistance offset value $R_{Offset}$, the two van der Pauw transresistances $R_{VdP1}$ and $R_{VdP2}$ and the differential resistance voltage $\Delta V_W$ change under the influence of mechanical stresses on the semiconductor chip.

It can be shown from equation (7) and equation (9) that the Van der Pauw equation is equivalent to $$R_{sq} = \frac{\pi}{\ln 2 + \ln\cosh\left(\frac{\pi}{2}\frac{R_{Offset}}{R_{sq}}\right)} R_{vdp} \qquad (10)$$

The nonlinear equation (7) can be solved by iterating this equation (10), for instance by starting from the initial value $R_{sq}=\infty$. Because typically $R_{offset} \ll R_{VdP}$ and $R_{Offset} \ll R_{sq}$, the iterative solution often converges with only one or two iterations. With one iterative step, the following is obtained:

$$R_{sq} = \frac{\pi}{\ln 2} R_{vdP}$$

With two iterative steps, the following is obtained:

$$R_{sq} = \frac{\pi}{\ln 2 + \ln\cosh\left(\frac{\ln 2}{2}\frac{R_{Offset}}{R_{vdP}}\right)} R_{vdP}$$

The right side of this equation may be represented as a series, and can be approximately calculated with the inclusion of terms up to the second order of $R_{Offset}$ as $$R_{sq} = \frac{\pi}{\ln 2}\left(R_{vdP} - \frac{\ln 2}{8}\frac{R_{Offset}^2}{R_{vdP}}\right)$$

The van der Pauw transresistance measurements (here described as being obtained from voltage measurements in combination with current excitation) thus serve to measure the stress-related change in resistance of the sheet resistance $R_{sq}$ of the well 8 of the Hall element 1. The sheet resistance $R_{sq}$ depends primarily on the isotropic stress $\sigma_{iso}$, while the influence of the differential stress $\sigma_{diff}$ and the shear stress $\sigma_{xy}$ are second-order effects.

If the offset $R_{Offset}$ vanishes or is negligibly small, then the following is a good approximation:

$$R_{vdP1} \cong R_{vdP2} \qquad (11)$$

In this case, equation (7) can be solved and yields the following equivalent relationships:

$$R_{sq} = \frac{\pi}{\ln 2} R_{vdP1} = \frac{\pi}{\ln 2} R_{vdP2} = \frac{\pi}{2\ln 2}(R_{vdP1} + R_{vdP2}) \qquad (12)$$

The above provides a way to determine $R_{sq}$, hence a way to determine $\epsilon_I$—see equation (8), knowing that the influence of both differential stress (represented by $\epsilon_D$) and shear stress (represented by $\epsilon_\tau$) only have a second-order influence on $R_{sq}$.

From the above is has become clear that a plurality of measurement signals are required to determine the stress signal, for instance two Van der Pauw measurement signals, or a single Van der Pauw measurement signal combined with one or more diagonal measurement signals.

In embodiments of the present invention, such signals may be sequentially determined, and the sensor may correspondingly be adapted for sequentially determining the measured values of the various measurement set-ups from a single Hall element (1).

Figure 4:
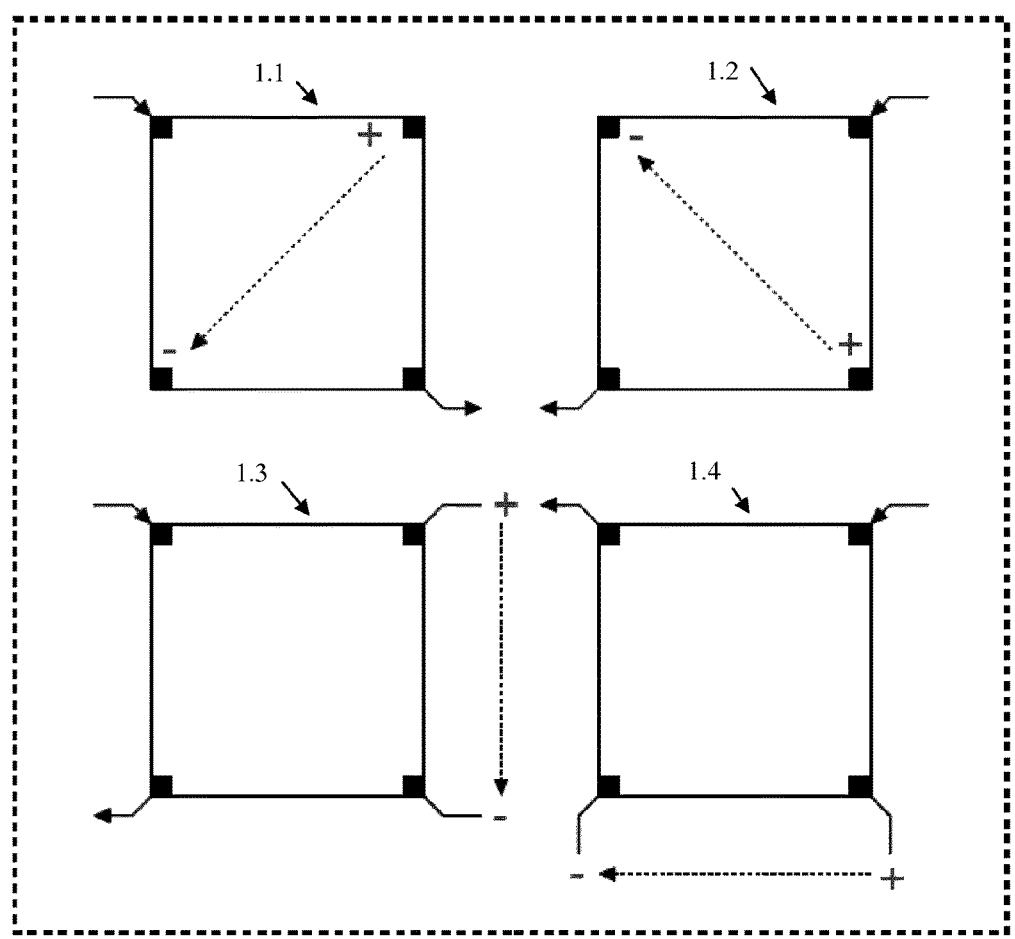
FIG. 4 illustrates an embodiment of a sensor with a plurality of Hall elements.

Alternatively, a sensor according to embodiment of the present invention may comprise a plurality of Hall elements 1.1, 1.2, 1.3, 1.4 on a same chip, as illustrated in FIG. 4. Each Hall element 1.1, 1.2, 1.3, 1.4 has a plate-shaped area made of a doped semiconductor material and four contacts contacting the plate-shaped area, the contacts of a Hall element forming corners of a quadrangle, two neighbouring corners of the quadrangle defining an edge thereof. The Hall elements 1.1, 1.2, 1.3, 1.4 furthermore each comprise (not illustrated in FIG. 4, but similar to FIG. 1) a switching matrix, a current source for supplying a current, and a differential amplifier for measuring a voltage generated by the supplied current. The plurality of Hall elements 1.1, 1.2, 1.3, 1.4 have a microcontroller. The sensor may be adapted for simultaneously determining the measured values of the various measurement set-ups from a plurality of Hall elements. In particular embodiments, the sensor may be adapted for simultaneously determining at least two orthogonal diagonal measurements and/or at least one Van der Pauw transresistance measurement from different Hall elements.

B) Determining the Stress Signal

The stress signal may be represented as a stress voltage $V_S$. The stress voltage $V_S$ should be a value which is dependent on the isotropic stress $\sigma_{iso}$, but which is not strongly influenced by the differential stress $\sigma_{diff}$ and the shear stress $\sigma_{xy}$. The stress voltage $V_S$ is a nonlinear function $F(V_{sq}, V_{Offset}, \Delta V_W)$ of the values $V_{sq}$, $V_{Offset}$ and $\Delta V_W$ which are measured and calculated using the measurement setup. The values $V_{sq}$ and $R_{sq}$ are linked by the known current I applied in the measurement set-up as $V_{sq}=R_{sq}*I$. Similarly, $V_{offset}=R_{offset}*I$.

The function F can, for example, be determined by means of finite element simulations under various stress conditions. The values $V_{sq}$, $V_{Offset}$ and $\Delta V_W$ are calculated for a given current I for each stress condition. The function $F(V_{sq}, V_{Offset}, \Delta V_W)$ is then determined, for example, by minimizing, the deviations $$F(V_{sq}, V_{Offset}, \Delta V_w) - \frac{\rho_0(T)}{d}I(1+\varepsilon_I) \quad (13)$$

for instance according to the least-squares method, that is, by means of a least-squares fit.

Given that the contacts 9 are small contacts which are arranged on the edge of the well 8 of the Hall element 1, the following equations apply as a good approximation:

$$V_{sq} \approx \frac{\rho_0(T)}{d}I\sqrt{(1+\varepsilon_I)^2 - \varepsilon_D^2 - \varepsilon_T^2} \quad (14)$$

$$V_{Offset} \approx \frac{1}{\Gamma_1}\frac{\rho_0(T)}{d}I[\cos(2\theta)\varepsilon_D + \sin(2\theta)\varepsilon_T]$$

$$\Delta V_W \approx \frac{1}{\Gamma_2}\frac{\rho_0(T)}{d}I[-\sin(2\theta)\varepsilon_D + \cos(2\theta)\varepsilon_T]$$

Figure 3:
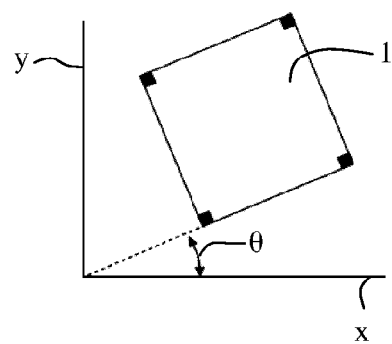
FIG. 3 shows the orientation of the Hall element with respect to the edges of the semiconductor chip.

The angle $\theta$ denotes the angle formed by the edges of the Hall element 1 and the edges of the semiconductor chip (indicated by straight lines), as illustrated in FIG. 3. $\Gamma_1$ and $\Gamma_2$ are coefficients which depend on the geometry of the well 8 and the position and size of the contacts 9 of the Hall element 1.

If the sheet resistance voltages $V_{sq}$, the offset voltage $V_{Offset}$ and the differential resistance voltage $\Delta V_W$ are combined according to $$V_S = \sqrt{V_{sq}^2 + \Gamma_1^2 V_{Offset}^2 + \Gamma_2^2(\Delta V_W)^2} \quad (15)$$

it follows from equations (12) to (14) that the stress voltage $V_S$ of the following equation $$V_S \approx \frac{\rho_0(T)}{d}I(1+\varepsilon_I)$$

is sufficient and thus depends solely on the isotropic stress $\sigma_{iso}$. The stress voltage $V_S$ is thus a value for the isotropic stress $\sigma_{iso}$ which can be determined directly from measurements. The values for $\Gamma_1$ and $\Gamma_2$ can be adjusted such that the influence of differential stress or shear stress on the stress voltage $V_S$ is minimal. For example, they can be determined by means of finite element simulation or experimentally. In the case of a square Hall element 1 having contacts 9 arranged in the corners, the values for $\Gamma_1$ and $\Gamma_2$ are approximately $\Gamma_1=0.82$ $\Gamma_2=0.6$ The following is a preferred embodiment of the Hall sensor:

A wafer made of (100) silicon with a <110> flat is used as the base material.

The edges of the semiconductor chips are arranged parallel or orthogonal to the flat.

The edges of the Hall element 1 run parallel to the edges of the semiconductor chip, that is, the angle $\theta=0$.

In this case, the following apply:

$$V_{Offset} \approx \frac{1}{\Gamma_1}\frac{\rho_0(T)}{d}\frac{\pi_{44}}{2}(\sigma_{xx}-\sigma_{yy})I$$

and $$\Delta V_W \approx \frac{1}{\Gamma_2}\frac{\rho_0(T)}{d}(\pi_{11}-\pi_{12})\sigma_{xy}I$$

If the differential stress $\sigma_{xx}-\sigma_{yy}$ and the shear stress $\sigma_{xy}$ are negligibly small, then $V_{Offset} \cong 0$ and $\Delta V_W \cong 0$ apply, and equation (15) simplifies to $$V_S = V_{sq}$$

and it follows with equation (11) and the link between $V_s$ and $R_s$, respectively between $V_{sq}$ and $R_{sq}$ that the stress voltage $V_S$ can be determined by measuring a single van der Pauw voltage, for example, the van der Pauw voltage $V_{vdP1}$ or the van der Pauw voltage $V_{vdP2}$, or preferably by measuring and averaging the two van der Pauw voltages $V_{vdP1}$ and $V_{vdP2}$.

If the differential stress $\sigma_{xx}-\sigma_{yy}$ is not negligibly small, but the shear stress $\sigma_{xy}$ is negligibly small, then $\Delta V_W \cong 0$ applies and the equation (15) simplifies to $$V_S = \sqrt{V_{sq}^2 + \Gamma_1^2 V_{Offset}^2} \quad (16)$$

If the differential stress $\sigma_{xx}-\sigma_{yy}$ is negligibly small, but the shear stress $\sigma_{xy}$ is not negligibly small, then $V_{Offset} \cong 0$ applies and the equation (15) simplifies to $$V_S = \sqrt{V_{sq}^2 + \Gamma_2^2(\Delta V_W)^2} \quad (17)$$

The resistance measurements in the switching positions 5 and 6 of the measurement set-up as explained above are thus required only if the shear stress $\sigma_{xy}$ is not negligibly small.

C) Determining a Relative Stress Signal

The stress signal or the stress voltage $V_S$ depends on the isotropic stress $\sigma_{iso}$, but unfortunately also on the temperature T, e.g. via $\rho_0(T)$. Furthermore, in obtaining the various measurements, it has been assumed until now that the applied current I is known. However, it will become apparent that this is not essential when the normalization as described hereafter is applied to obtain relative stress signals. Therefore, in embodiments of the present invention in which these relative stress signals are used, it is allowed that the applied current I for obtaining these measurements varies with temperature. The notation I(T) is introduced to make this explicit. The change of I with temperature can either be intentionally introduced, e.g. to control the range of voltages that can appear over the plate, and/or it can be a parasitic effect, e.g. because the on-chip current source is not perfectly stable with temperature.

In order to obtain a stress signal that is independent of the temperature T, a relative stress signal $V_{Srel}$ may be generated. The relative stress signal $V_{Srel}$ may, for example, be the ratio of the stress voltage $V_S$ with respect to a reference function $V_{S,ref}(T)$ which is dependent on the temperature T:

$$V_{Srel} = \frac{V_S}{V_{S,ref}(T)}$$

Alternatively, the relative stress signal $V_{Srel}$ may, for example, be the stress voltage $V_S$ of which a reference function $V_{S,ref}(T)$ which is dependent on the temperature T is subtracted:

$$V_{Srel} = V_S - V_{S,ref}(T)$$

In all cases, the reference function $V_{S,ref}(T)$ may be determined by means of a calibration procedure. The calibration is performed as described in the section 'IV. Acquiring the calibration data'. It is clear that since both readings $V_S(T)$ and $V_{S,ref}(T)$ are proportional to the same current I(T), the precise value is immaterial in case of the ratio of stress voltage $V_S$ to reference function $V_{S,ref}(T)$ because it drops out in the ratio.

If the stress sensor is used at a fixed temperature $T_r$ or in a relatively narrow temperature range, the reference function $V_{S,ref}(T)$ can then be replaced by a fixed reference value.

Since it is essentially the isotropic stress $\sigma_{iso}$ which causes the piezo-Hall effect, the stress voltage $V_S$ is suitable for a Hall element for compensating for the piezo-Hall effect. The Hall element 1 is thus useful both for measuring the isotropic stress and for measuring the component of the magnetic field which runs perpendicular to its active surface. This will be explained below.

III. Modelling the Stress and/or Temperature Compensation of the Hall Element

The output signal $D_{Out}$ of the Hall sensor should be independent of temperature and independent of stress, which is generally referred to below as stress σ. Based on the currently measured temperature T, and the current readouts $V_{Hall}$ and $V_S$, in accordance with embodiments of the present invention, a stress- and temperature-compensated (digital) output $D_{out}$ is derived by multiplying the Hall voltage value $V_{Hall}$ by a correction factor. The output signal $D_{Out}$ may be modelled according to embodiments of the invention via the relationship $$D_{Out} = \frac{V_{Hall}}{V_{Hall,ref}(T)} h(V_{Srel}(T), \gamma(T)) B_{ref}$$

where the function h is dependent on the relative stress signal $V_{Srel}$, or an equation which is mathematically equivalent. $B_{ref}$ is a reference magnetic field to which the function $V_{Hall,ref}(T)$ relates.

In particular embodiments of the relative stress value as indicated above, this comes down to $$D_{Out} = \frac{V_{Hall}}{V_{Hall,ref}(T)} h(V_S/V_{S,ref}(T), \gamma(T)) B_{ref} \quad (18)$$

where the function h is dependent on the ratio $V_S/V_{S,ref}(T)$, and is, for example, the following function:

$$h(V_S/V_{S,ref}(T), \gamma(T)) = \frac{1}{1 - \gamma(T)\left(\frac{V_S}{V_{S,ref}(T)} - 1\right)} \quad (19)$$

or to $$D_{Out} = \frac{V_{Hall}}{V_{Hall,ref}(T_a)} h(V_S - V_{S,ref}(T_a), \gamma(T_a)) B_{ref}$$

where the function h is dependent on the difference between $V_s$ and $V_{s,ref}(T)$.

In the above:
- $V_{Hall}$ is a Hall voltage value obtained via the measurements as explained above, which is given by:

$$V_{Hall} = \frac{1}{2}*(V_{diag1} + V_{diag2}) \quad (20)$$

- $V_S$ is the stress voltage determined by the measurements.
- $V_{Hall,ref}(T)$ and $V_{S,ref}(T)$ are reference functions, which, for the case in which a reference magnetic field having the strength $B_{ref}$ is present at the Hall element, are determined by means of a calibration and stored in the microcontroller 6 of the Hall sensor.
- γ(T) is a reference function which is dependent on the material properties of the well 8 of the Hall element 1, which can be closely approximated by $$\gamma(T) \approx -\frac{2P_{12}(T)}{\prod_{11}(T) + \prod_{12}(T)} \quad (21)$$

Values from the literature, in particular for instance the works of B. Hälg (Piezo-Hall coefficients of n-type silicon, J. Appl. Physics 64 (1), 1 Jul. 1988), of Y. Kanda (A Graphical Representation of Piezoresistance Coefficients in Silicon, IEEE Transactions on electron devices, Vol. ED-29, No. 1, January 1982) and of Ch. Smith (Piezoresistance Effect in Germanium and Silicon, Physical Review, Vol. 94, Number 1, Apr. 1, 1954), provide the value of the function γ(T=25° C.) for a well 8 with a low level of doping of N=3*10$^{16}$ as approximately $$\gamma(T=25° C.) = 2*40\%/GPa/48\%/GPa = 1.66 \quad (22)$$

The temperature coefficients of $P_{12}$, $\pi_{11}$ and $\pi_{12}$ are approximately $$TC(P_{12}) = -1750 \text{ ppm}/° C.$$

$$TC(\pi_{11}) = TC(\pi_{12}) = -3350 \text{ ppm}/° C. \quad (23)$$

The reference function γ(T) can, for example, be represented as a second-degree polynomial. The values specified in equations (21) to (23) yield $$\gamma(T) = 1.66 + 0.0016*(T-25° C.) + 0.000005*(T-25° C.)^2$$

Equation (19) can be developed as a Taylor series, and equation (18), taking into consideration only the first-order term, may thus be represented as $$D_{Out} = \frac{V_{Hall}}{V_{Hall,ref}(T)}\left(1 + \gamma(T)\left(\frac{V_S}{V_{S,ref}(T)} - 1\right)\right)B_{ref}$$

If the Hall sensor is used at a fixed temperature $T_r$ or in a relatively narrow temperature range, the reference functions $V_{Hall,\,ref}(T)$ and $V_{S,\,ref}(T)$ and the function $\gamma(T)$ may then be replaced by constant reference values, that is, $$V_{Hall,ref}(T) = V_{Hall,ref}(T_r) = V_{Hall,ref}$$

$$V_{S,ref}(T) = V_{S,ref}(T_r) = V_{S,ref}$$

$$\gamma(T) = \gamma$$

where the values $V_{Hall,\,ref}(T_r)$ and $V_{S,\,ref}(T_r)$ according to the calibration procedure described below are determined only for the temperature $T_r$. In this case, equation (18) results as $$D_{Out} = \frac{V_{Hall}}{V_{Hall,ref}} h(V_S/V_{S,ref}, \gamma)B_{ref}$$

and thus, for example, with equation (19)

$$D_{Out} = \frac{V_{Hall}}{V_{Hall,ref}}\left(\frac{1}{1 - \gamma * \left(\frac{V_S}{V_{S,ref}} - 1\right)}\right)B_{ref}$$

$$D_{Out} = \frac{V_{Hall}}{V_{Hall,ref}}\left(1 + \gamma * \left(\frac{V_S}{V_{S,ref}} - 1\right)\right)B_{ref}$$

The output signal $D_{out}$ of the Hall sensor is stress-compensated.

IV. Acquiring the Calibration Data

The calibration is explained using the example of the Hall sensor. The calibration of the stress sensor is performed in an analogue manner. However, the application of a magnetic field $B_{ref}$ and the determination of the Hall voltage value are then unnecessary.

In order to define the calibration procedure, it is assumed that the measurement system has three readings available.

The first reading is a (highly reproducible) reading T of the temperature.

The second reading is $V_{Hall}$, representing the offset-compensated Hall voltage which contains the information on the magnetic field B. With the spinning-current readout method for Hall, the following signal is available:

$$V_{Hall}(T, \sigma, B) = \frac{\rho_0(T)}{d} I(T) \cdot (1 + \epsilon_H(T, \sigma)) \cdot \mu_H(T) \cdot B \qquad (24)$$

Here, σ has been introduced to represent the (multi-component) stress state. The notation $\epsilon_H(T, \sigma)$ is used to remind the reader of the fact that $\epsilon_1$ not only depends on the stress state σ, but also on temperature T because of temperature-dependent material properties.

The third reading available in the system is the stress signal $V_S$, which is a measure of isotropic stress. When second-order influences of differential and shear stress can be neglected, $V_S = R_{sq}*I(T)$ can be taken. Otherwise, these second-order influences can be compensated according to the methods described hereinabove. In both cases, the following dependency on isotropic stress applies:

$$V_S(T, \sigma) = \frac{\rho_0(T)}{d} I(T) \cdot (1 + \epsilon_I(T, \sigma)) \qquad (25)$$

Again, the notation $\epsilon_H(T, \sigma)$ is there to emphasize the direct temperature-dependency inherited from temperature-dependent material properties. In a microcontroller-based embodiment of the measurement system, the signals T, $V_{Hall}$ and $V_S$ are digital values available in the microcontroller. It has already been detailed above how these signals can be derived from various measurements. The calibration approach described here only assumes that these signals are available, and that the information contained therein is in good approximation of what is specified in (24) and (25).

It is an advantage of a calibration method according to embodiments of the present invention that no measurements at zero-stress conditions are required.

A) Characterizing Over Temperature

There are two important elements that make calibration non-trivial. The first one is that $V_{Hall}$ and $V_S$ are affected by many temperature-dependent electrical and mechanical material properties. For instance, following material properties are temperature-dependent:

$$\frac{\rho_0(T)}{d}$$

I(T), $\mu_H(T)$, $\pi_{11}(T)$, $\pi_{12}(T)$, $P_{12}(T)$, etc. The second challenge is that no direct information on the stress state σ is available. From the point of the calibration procedure, the actual stress σ in the die is unknown. Moreover, the stress is in itself also a function of temperature. This is because stress in the die is mostly caused by differences in thermal expansion of different materials. For an unpackaged die, stress arises due to different materials used in the die processing (e.g., metal layers compared to silicon). For packaged sensors, the difference in thermal expansion of the package relative to the die causes typically high stress levels (especially with plastic packages).

An element of the calibration approach according to embodiments of the present invention consist of characterizing the sensor signals $V_{Hall}$ and $V_S$ over temperature. The procedure to do this is described first. It is to be noted that the exact conditions under which the characterization takes place will be detailed later. For instance, the sensor considered here could be still on the wafer (i.e., unpackaged), could be a naked die after sawing the wafer up, or it could be the packaged sensor. In each of these cases, it might be that also external forces are applied to the sensor in order to alter the stress level. This could also be achieved by changing the moisture-level of the package.

The calibration serves to determine the functions $V_{Hall}$ and $V_S$, and comprises the following steps:

Bringing the sensor to various predetermined temperatures $T_i$, wherein the index i assumes values from 1 to n and n is an integer with n≥1. For example, n=3 and $T_1 = -40°$ C., $T_2 = 25°$ C. and $T_3 = 125°$ C.

Applying a reference magnetic field $B_{ref}$

Measuring the current actual temperature of the Hall element $T_{act}(i)$

Measuring the diagonal voltages $V_{diag1,\,ref}(i)$ and $V_{diag2,\,ref}(i)$

Measuring at least one and possibly a second van der Pauw voltage $V_{vdP1, ref}(i)$, $V_{vdP2, ref}(i)$
and from that
Calculating the Hall voltage value $V_{Hall, ref}(i)$ using equation (20), and
Calculating the stress voltage $V_{S, ref}(i)$.

The stress signals $V_{S, ref}(i)$ are calculated according to the use of the sensor and/or the expected mechanical stresses based on equation (*19) or (16) or (17).

During calibration, the sensor will experience a certain stress level. When changing the temperature, the stress will change: $\sigma = \sigma_{ref}(T)$. The stress level during calibration $\sigma_{ref}(T)$ is unknown in itself, but it is fairly reproducible as long as the main environmental factors remain the same: same humidity of the package, same aging effects, same external forces on the package, etc. A magnetic field $B=B_{ref}$ is now applied, the sensor is brought to a number of different temperatures. At each temperature, the temperature sensor provides a reading $T_i$, a read-out of the Hall signal $V_{Hall}$ and the stress signal $V_S$. These readings form what will be called the reference values:

$$\begin{cases} V_{Hall,ref}[i] = V_{Hall}(T_i, \sigma_{ref}(T_i), B_{ref}) \\ V_{S,ref}[i] = V_S(T_i, \sigma_{ref}(T_i)) \end{cases} \quad (26)$$

The calibration data consist of the i=1 to n data sets $\{T_{act}(i), V_{Hall, ref}(i), V_{S, ref}(i)\}$. Through a curve-fit (e.g., up to second order), the different points $(T_i; V_{Hall,ref}[i])$ can be turned into a reference curve $V_{Hall,ref}(T)$. This provides a means for interpolating measured results for temperature T different from the measurement temperatures $T_i$. Likewise, the different points $(T_i; V_{S,ref}[i])$ can be turned into a reference curve $V_{S,ref}(T)$. The two reference functions $V_{Hall, ref}(T)$ and $V_{S, ref}(T)$ are preferably represented as second-order or higher-order polynomials. In this case, the coefficients of the polynomials may be determined using ordinary statistical methods, for example, a mathematical fit, from the n data sets $\{T_{act}(i), V_{Hall, ref}(i)\}$ or $\{T_{act}(i), V_{S, ref}(i)\}$, and are stored in the microcontroller 6 of the Hall sensor.

It is recalled now that $V_{Hall}$ and $V_S$ both depend on temperature and stress. In order to be able to make the distinction between temperature-effects and stress-effects, a second characterization is performed. In practice, this second characterization can precede the first one, or the first and second sets may be done alternatively for the same temperature. If a sensor device would be used always at a same temperature, or within a narrow temperature range, the first characterisation (characterisation under temperature effects) is not strictly required.

The main requirement for the second characterisation is that, compared to the reference calibration measurements, a significantly different stress conditions applies. The stress during this calibration step is denoted as $\sigma = \sigma_{sec}(T)$. The actual stress level is again unknown, but it can be made sure that the second stress level $\sigma_{sec}$ differs sufficiently from the reference level $\sigma_{ref}$ (at each temperature). The measurements may be done with a magnetic field $B_{sec}$ applied. In principle, the same field can be applied during both calibrations: $B_{sec}=B_{ref}$. However, if this is not practical (e.g., if different equipment is used to generate these fields), the field $B_{sec}$ applied during the second characterization may be different from the reference magnetic field $B_{ref}$. The requirement here is that the fraction $B_{sec}/B_{ref}$ is well known. This is either by design (by using the same field, and hence $B_{sec}/B_{ref}=1$), or otherwise because this fraction is measured or calibrated in some way in the test-setup. A second set of measurement values are now obtained:

$$\begin{cases} V_{Hall,sec}[j] = V_{Hall}(T_j, \sigma_{sec}(T_j), B_{sec}) \\ V_{S,sec}[j] = V_S(T_j, \sigma_{sec}(T_j)) \end{cases} \quad (27)$$

Also here, this data set can be translated into functions $V_{Hall,sec}(T)$ and $V_{S,sec}(T)$ that allow obtaining interpolated results at any temperature. It is to be noted that for determining these functions, the set of temperatures $\{T_j\}$ in (27) do not have to be the same as the ones used in (26), i.e. $\{T_i\}$.

The value $B_{ref}$ of the reference magnetic field and the reference function $\gamma(T)$ may also be stored in the microcontroller 6 of the Hall sensor. The calibration is thus completed. The reference function $V_{Hall, ref}(T)$ is related to the reference magnetic field $B_{ref}$, that is, $V_{Hall, ref}(T)$ is proportional to $B_{ref}$.

The calibration may, for example, be performed on the Hall sensor packaged in a housing. However, it may also be performed if the wafer with the Hall sensors has not yet been sawed, or it may be performed on the Hall sensors before they are moulded into a housing.

If a sufficient amount of calibration data has been collected for a particular end product, it may then be possible to perform the calibration in another manner.

In order to increase the accuracy, the reference function $\gamma(T)$ can also be determined experimentally. This may be done in to different ways, and the approach can be selected which gives the best accuracy.

First, $\gamma(T)$ can be derived from the interpolating functions $V_{Hall,sec}(T)$, $V_{Hall,ref}(T)$, $V_{S,sec}(T)$ and $V_{S,ref}(T)$, as in equation (28). Thus, for various temperatures, i=1 to n first data sets $\{T_{act}(i), V_{Hall, ref}(i), V_{S, ref}(i)\}$ are performed for stress condition 1, and k=1 to h second data sets $\{T_{act}(k), V_{Hall, sec}(k), V_{S, sec}(k)\}$ are performed for stress condition 2. Under stress condition 1, the magnetic field $B_{ref}$ is applied, and under stress condition 2, the magnetic field $B_{sec}$ is applied. $B_{sec}$ can be equal to $B_{ref}$. For example, n=3 and h=3. If the data are represented as calibration functions $V_{Hall, ref}(T)$, $V_{S, ref}(T)$, $V_{Hall, sec}(T)$ and $V_{S, sec}(T)$, the reference function $\gamma(T)$ may be specified as follows:

$$\gamma(T) = \frac{\frac{V_{Hall,sec}(T)}{V_{Hall,ref}(T)} \frac{B_{ref}}{B_{sec}} - 1}{1 - \frac{V_{S,sec}(T)}{V_{S,ref}(T)}} \quad (28)$$

Second, measurements can be done for a common temperature set $\{T_i\}$, and the values $$\gamma[i] = \frac{\frac{V_{Hall,sec}[i] B_{ref}}{V_{Hall,ref}[i] B_{sec}} - 1}{1 - \frac{V_{S,sec}[i]}{V_{S,ref}[i]}} \quad (29)$$

can be calculated directly from measured values. Then the set (Ti, $\gamma[i]$) can be translated into a fitting function $\gamma(T)$.

The following table provides an overview of possible calibration measurements with various stress conditions.

These are only a limited number of possibilities, which attract attention because they are interesting special cases.

| Option no. | Stress condition 1 for $V_{Hall, ref}(T), V_{s, ref}(T)$ | Stress condition 2 for $V_{Hall, sec}(T)$ and $V_{s, sec}(T)$ |
|---|---|---|
| 1 | Sensor on wafer, not sawed (wafer-level) | Sensor packaged |
| 2 | Sensor packaged | Sensor on wafer, not sawed (wafer-level) |
| 3 | Sensor packaged and sensor housing dry | Sensor packaged and sensor housing moist |
| 4 | Sensor packaged | External force on the sensor housing |

The most important calibration data comes from the "reference" situation, as is evident in the direct use of $V_{Hall,ref}(T)$ and $V_{S,ref}(T)$ in (18). As is clear from this table, the calibration method according to embodiments of the present invention does not require the reference measurements to be done under zero-stress. In such cases, the stress $\sigma=\sigma_{ref}(T)$ which is present during the calibration is unknown, and affects the reference measurements $V_{Hall, ref}(T)$, $V_{S, ref}(T)$. However, it can be shown mathematically that if the stress condition $\sigma=\sigma_{sec}(T)$ during measurement of $V_{Hall, sec}(T)$ and $V_{S, sec}(T)$ is for all temperatures T sufficiently different from $\sigma_{ref}(T)$, the temperature- and stress compensated output Dout according to for instance (18), (19), and $\gamma(T)$ determined by (28) becomes insensitive to the actual stress situations $\sigma_{ref}(T)$ and $\sigma_{sec}(T)$ that actually occur during these measurements.

It is possible that the calibration function represented by $\gamma(T)$ turns out to be fairly reproducible, in which case a standard curve could be used. Otherwise, it will be required to characterize $\gamma$ by doing "extra" calibration measurements (the second set of measurements), and then use for instance (29) to extract the corresponding values. For each temperature this is done for, a value of $\gamma$ for that particular temperature is obtained. It is possible that a single temperature will be sufficient to define the whole curve, e.g., by using standard temperature coefficients to extrapolate to other temperatures. In other cases, the second set of measurements (*HH) will need to contain readings at two or more temperatures.

The method according to embodiments of the present invention is not limited to Hall elements having four contacts, but may readily be transferred to Hall elements having k*4 contacts, where k is an integer.

The present invention has been explained using an example in which the correction to compensate for the change in the Hall voltage value of the Hall element 1 caused by the mechanical stress and the temperature is performed in a calculated manner in the microcontroller 6. However, it is also possible to compensate for the influence of the temperature and/or the mechanical stress via a change in the Hall current.

The invention claimed is:

1. Method for determining isotropic stress by means of a Hall element which has a plate-shaped area made of a doped semiconductor material and comprises four contacts contacting the plate-shaped area, the contacts forming corners of a quadrangle, two neighbouring corners of the quadrangle defining an edge thereof, the method comprising:

determining at least one van der Pauw transresistance value ($R_{vdp1}$) in at least one van der Pauw measurement setup of the Hall element, wherein the four contacts of the Hall element form contact pairs, a contact pair comprising two contacts which are neighbouring corners of the quadrangle, one contact pair being used for supplying a current (I) and the other contact pair being used for measuring a voltage ($V_{vdp1}$), a relationship between the supplied current (I) and the measured voltage ($V_{vdp1}$) defining the Van der Pauw transresistance value ($R_{vdp1}$);

determining a stress signal ($V_S$) which depends at least on the at least one Van der Pauw transresistance value ($R_{vdp1}$); and determining the isotropic stress by comparing the determined stress signal ($V_s$) with a predetermined reference stress signal ($V_{Sref}(T)$) which is temperature-dependent.

2. Method according to claim 1, furthermore comprising calculating a sheet resistance value ($R_{sq}$) from the at least one van der Pauw transresistance value ($R_{vdp1}$, $R_{vdp2}$) and using the sheet resistance for determining the stress signal ($V_s$).

3. Method according to claim 2, wherein calculating a sheet resistance value ($R_{sq}$) from the at least one van der Pauw transresistance value ($R_{vdp1}$, $R_{vdp2}$) includes solving the van der Pauw equation $$\exp\left(-\pi\frac{R_{vdp1}}{R_{sq}}\right) + \exp\left(-\pi\frac{R_{vdp2}}{R_{sq}}\right) = 1$$

or a mathematically equivalent relation which can be derived from this, possibly by using linear relations that exist between transresistance measurements performed on the Hall element.

4. Method according to claim 1, wherein determining at least one Van der Pauw transresistance value ($R_{vdp1}$, $R_{vdp2}$) includes determining the at least one Van der Pauw transresistance value on a Hall element in which the contacts are respectively uniformly angularly displaced by 90°.

5. Method according to claim 1, wherein determining at least one Van der Pauw transresistance value ($R_{vdp1}$, $R_{vdp2}$) comprises:

measuring a first Van der Pauw transresistance value ($R_{vdp1}$) in a first Van der Pauw measurement set-up wherein a first contact pair consisting of neighbouring contacts is used for supplying current and a second contact pair comprising neighbouring contacts is used for measuring a voltage, the second contact pair being different from the first contact pair; and measuring a second Van der Pauw transresistance value ($R_{vdp2}$) in a second Van der Pauw measurement set-up wherein a third contact pair consisting of neighbouring contacts is used for supplying current and a fourth contact pair consisting of neighbouring contacts is used for measuring a voltage, the third contact pair being different from the first and the fourth contact pair and the fourth contact pair being different from the second contact pair, all contact pairs consisting of two out of the four contacts of the plate.

6. Method according to claim 1, wherein determining at least one Van der Pauw transresistance value ($R_{vdp1}$, $R_{vdp2}$) comprises measuring a first Van der Pauw transresistance value ($R_{vdp1}$) in a first Van der Pauw measurement set-up wherein a first contact pair consisting of neighbouring contacts is used for supplying current and a second contact pair consisting of neighbouring contacts is used for measuring a voltage, the second contact pair being different from the first contact pair; and measuring at least a first diagonal transresistance value ($R_{diag1}$) in a first diagonal measurement set-up on the Hall element, a fifth contact pair being used for supplying a current and a sixth contact pair being used for measuring a voltage, the contacts of the fifth contact pair being interleaved along the edge of the quadrangle with the contacts of the sixth contact pair, all contact pairs consisting of two out of the four contacts of the plate, a relationship between the supplied current and the measured voltage defining the diagonal transresistance value ($R_{diag1}$); and calculating a second Van der Pauw transresistance value from the first Van der Pauw transresistance value ($R_{vdp1}$) and the at least first diagonal transresistance ($R_{diag1}$).

7. Method according to claim 6, wherein measuring at least a first diagonal transresistance value comprises measuring a first diagonal transresistance value ($R_{diag1}$) in a first diagonal measurement set-up; and measuring a second diagonal transresistance value ($R_{diag2}$) in a second diagonal measurement set-up different from the first diagonal measurement set-up, and wherein calculating a second Van der Pauw transresistance ($R_{VdP2}$) value comprises calculating the second Van der Pauw transresistance value ($R_{VdP2}$) from the first Van der Pauw transresistance value ($R_{vdp1}$) and the sum or difference of the two diagonal transresistances.

8. Method according to claim 1, wherein determining the stress signal ($V_S$) which depends at least on the at least one Van der Pauw transresistance value ($R_{vdp1}$) includes taking the stress signal ($V_s$) proportional to the sheet resistance value ($R_{sq}$).

9. Method for determining a component of a magnetic field by means of a Hall element which has a plate-shaped area made of a doped semiconductor material and comprises four contacts contacting the plate-shaped area, the Hall element being located in the magnetic field, the method comprising:

determining the relative stress signal ($V_{Srel}$) by means of the Hall element, according to claim 7;

calculating a Hall voltage value ($V_{Hall}$) proportional to the magnetic field by adding a first diagonal voltage proportional to the first diagonal transresistance value ($R_{diag1}$) and a second diagonal voltage proportional to the second diagonal transresistance value ($R_{diag2}$);

calculating the component of the magnetic field from the Hall voltage value ($V_{Hall}$), the relative stress signal ($V_{Srel}(T)$), and a reference Hall voltage value ($V_{Hall,ref}(T)$).

10. Method for determining a component of a magnetic field by means of a Hall element which has a plate-shaped area made of a doped semiconductor material and comprises four contacts contacting the plate-shaped area, the Hall element being located in the magnetic field, the method comprising:

determining the relative stress signal ($V_{Srel}(T)$) by means of the Hall element, according to claim 7;

measuring a temperature ($T_a$) of the Hall element;

calculating a Hall voltage value ($V_{Hall}$) proportional to the magnetic field by adding a first diagonal voltage proportional to the first diagonal transresistance value ($R_{diag1}$) and a second diagonal voltage proportional to the second diagonal transresistance value ($R_{diag2}$), calculating the values of reference functions at the temperature ($T_a$) of the Hall element; and calculating the component of the magnetic field from the measured Hall voltage value ($V_{Hall}$), the stress signal ($V_S$), and the reference functions at the temperature ($T_a$) of the Hall element.

11. Method according to claim 10, wherein the reference functions comprise a reference Hall function $V_{Hall,ref}(T)$, a reference function for the stress signal $V_{S,ref}(T)$ and a reference function $\gamma(T)$ dependent on material properties of the Hall element, wherein the parameter T denotes the temperature and wherein $h(V_{S,rel}(T), \gamma(T))$ denotes a function which depends on the relative stress signal ($V_{S,rel}(T)$) and on the reference function $\gamma(T)$, and wherein a value $D_{Out}$ is calculated for the component of the magnetic field according to the equation $$D_{Out} = \frac{V_{Hall}}{V_{Hall,ref}(T_a)} h(V_{S,rel}(T_a), \gamma(T_a)) B_{ref}$$

or an equation which is mathematically equivalent, wherein $B_{ref}$ is a reference magnetic field to which the function $V_{Hall,\,ref}(T)$ relates.

12. Method according to claim 11, wherein $h(V_{S,rel}(T), \gamma(T)) = h(V_S/V_{S,ref}(T), \gamma(T))$ and wherein a value $D_{Out}$ is calculated for the component of the magnetic field according to the equation $$D_{Out} = \frac{V_{Hall}}{V_{Hall,ref}(T_a)} h(V_S/V_{S,ref}(T_a), \gamma(T_a)) B_{ref}$$

or an equation which is mathematically equivalent, wherein $B_{ref}$ is a reference magnetic field to which the function $V_{Hall,\,ref}(T)$ relates.

13. Method according to claim 12, wherein $$h(V_S/V_{S,ref}(T), \gamma(T)) = \frac{1}{1 - \gamma(T)\left(\frac{V_S}{V_{S,ref}(T)} - 1\right)}$$

with Vs the stress signal, Vs,ref(T) a reference function for the stress signal in function of temperature T, $\gamma(T)$ a reference function dependent on material properties of the Hall element in function of temperature T.

14. Method according to claim 11, wherein $h(V_{S,rel}(T), \gamma(T)) = h(V_S - V_{S,ref}(T), \gamma(T))$ and wherein a value $D_{Out}$ is calculated for the component of the magnetic field according to the equation $$D_{Out} = \frac{V_{Hall}}{V_{Hall,ref}(T_a)} h(V_S - V_{S,ref}(T_a), \gamma(T_a)) B_{ref}$$

or an equation which is mathematically equivalent, wherein $B_{ref}$ is a reference magnetic field to which the function $V_{Hall,\,ref}(T)$ relates.

15. Method according to claim 11, wherein the reference functions $V_{Hall,ref}(T)$ and $V_{S,ref}(T)$ are determined by means of a calibration, which comprises at least the following steps:

applying a reference magnetic field $B_{ref}$, bringing the Hall element to various predetermined temperatures $T_i$, wherein the index i assumes values from 1 to n and n is an integer with n≥1, for each temperature $T_i$:
measuring the temperature $T_{act}(i)$ of the Hall element,
measuring a first ($V_{diag1}$) and a second diagonal voltage ($V_{diag2}$) in the two diagonal measurement setups of the Hall element wherein the four contacts of the Hall element form a first and a second contact pair, the first contact pair being used for supplying a current and the second contact pair being used for measuring a voltage, the contacts of the first contact pair being interleaved along the edge of the quadrangle with the contacts of the second contact pair, the first diagonal measurement set-up being different from the second diagonal measurement set-up, and calculating a Hall voltage value $V_{Hall,ref}(i)$;
measuring at least one van der Pauw transresistance value $R_{vdP}(i)$ in at least one van der Pauw measurement setup of the Hall element wherein the four contacts of the Hall element form a third and a fourth contact pair, the third contact pair consisting of neighbouring contacts and being used for supplying a current and the fourth contact pair consisting of neighbouring contacts and being used for measuring a voltage, the third contact pair being different from the fourth contact pair, a relationship between the supplied current and the measured voltage defining the Van der Pauw transresistance value ($R_{vdp1}$, $R_{vdp2}$);
calculating a stress voltage $V_{S,ref}(i)$;
and then
determining the reference function $V_{Hall,\ ref}(T)$ from the data sets $\{T_{act}(i), V_{Hall,\ ref}(i)\}$; and
determining the reference function $V_{S,\ ref}(T)$ from the data sets $\{T_{act}(i), V_{S,\ ref}(i)\}$.

16. Method according to claim 15,
wherein first data sets $\{T_{act}(i), V_{Hall,\ ref}(i), V_{S,\ ref}(i)\}$ are determined for a first stress condition of the Hall element (1) for various temperatures $T_i$ with $i=1$ to n, and second data sets $\{T_{act}(k), V_{Hall,\ sec}(k), V_{S,\ sec}(k)\}$ are determined for a second stress condition of the Hall element (1) for various temperatures $T_k$ with $k=1$ to h, wherein n and h are integers with $n \geq 1$ and $h \geq 1$,
wherein reference functions $V_{Hall,\ ref}(T)$ and $V_{S,\ ref}(T)$ are determined from the first data sets and reference functions $V_{Hall,\ sec}(T)$ and $V_{S,\ sec}(T)$ are determined from the second data sets, and
wherein the reference function $\gamma(T)$ is determined as $$\gamma(T) = \frac{\frac{V_{Hall,sec}(T)}{V_{Hall,ref}(T)} \frac{B_{ref}}{B_{sec}} - 1}{1 - \frac{V_{S,sec}(T)}{V_{S,ref}(T)}}$$

wherein the value $B_{ref}$ denotes the magnetic field applied when determining the first data sets and the value $B_{sec}$ denotes a magnetic field applied when determining the second data sets.

17. Stress sensor for measuring isotropic stress, comprising a Hall element which has a plate-shaped area made of a doped semiconductor material and comprises four contacts contacting the plate-shaped area, the contacts forming corners of a quadrangle, two neighbouring corners of the quadrangle defining an edge thereof, a switching matrix, a current source for supplying a current (I), a differential amplifier for measuring a voltage generated by the supplied current (I), and a microcontroller;
wherein the switching matrix is arranged to operate the Hall element in at least one van der Pauw measurement setup wherein the four contacts of the Hall element form two different contact pairs, a contact pair consisting of neighbouring contacts, one contact pair being used for supplying a current (I) and the other contact pair being used for measuring a voltage ($V_{Vdp1}$); and
wherein the switching matrix is arranged to operate the Hall element in two resistance measurement setups wherein four contacts of the Hall element form two contact pairs, a contact pair consisting of two contacts which are not neighbouring contacts of the quadrangle, a contact pair in a resistance measurement setup being used for supplying a current (I) and for measuring a voltage ($V_{W1}$, $V_{W2}$); and
wherein the microcontroller is arranged to generate a stress signal for isotropic stress from measured values ($V_{vdp1}$, $V_{W1}$, $V_{W2}$) of the various measurement setups.

18. Sensor according to claim 17, wherein the sensor is adapted for sequentially determining the measured values of the various measurement setups from a single Hall element.

19. Sensor according to claim 17, comprising a plurality of Hall elements on a same chip, each Hall element having a plate-shaped area made of a doped semiconductor material and four contacts contacting the plate-shaped area, the contacts of a Hall element forming corners of a quadrangle, two neighbouring corners of the quadrangle defining an edge thereof, a switching matrix, a current source for supplying a current (I), a differential amplifier for measuring a voltage generated by the supplied current (I), the plurality of Hall elements having a microcontroller;
the sensor being adapted for simultaneously determining the measured values of the various measurement setups.

20. Hall sensor for measuring a component of a magnetic field, comprising a Hall element which has a plate-shaped area made of a doped semiconductor material and comprises four contacts contacting the plate-shaped area, the contacts forming corners of a quadrangle, two neighbouring corners of the quadrangle defining an edge thereof, a switching matrix, a current source for supplying a current (I), a differential amplifier for measuring a voltage generated by the supplied current (I), and a microcontroller;
wherein the switching matrix is arranged to operate the Hall element in two orthogonal diagonal measurement setups wherein the four contacts of the Hall element form two contact pairs, a contact pair consisting of two contacts which are not neighbouring contacts of the quadrangle, one contact pair being used for supplying a current and the other contact pair being used for measuring a voltage, the two diagonal measurement setups being different from one another;
wherein the switching matrix is arranged to operate the Hall element in at least one van der Pauw measurement setup wherein the four contacts of the Hall element form two contact pairs, a contact pair consisting of neighbouring contacts, one contact pair being used for supplying a current (I) and the other contact pair being used for measuring a voltage ($V_{Vdp1}$); and
wherein the switching matrix is arranged to operate the Hall element in two resistance measurement setups wherein four contacts of the Hall element form two contact pairs, a contact pair consisting of two contacts which are not neighbouring contacts of the quadrangle, a contact pair in a resistance measurement setup being used for supplying a current (I) and for measuring a voltage ($V_{W1}$, $V_{W2}$); and wherein the microcontroller is arranged to generate a stress- and temperature-compensated output signal for the component of the magnetic field from measured values of the various measurement setups.

* * * * *